(12) United States Patent
Takeuchi et al.

(10) Patent No.: US 7,294,912 B2
(45) Date of Patent: Nov. 13, 2007

(54) SEMICONDUCTOR DEVICE

(75) Inventors: Katsuhito Takeuchi, Toyokawa (JP); Naohito Mizuno, Kariya (JP); Shinichi Hirose, Okazaki (JP); Hiroyuki Ban, Hazu-gun (JP)

(73) Assignee: Denso Corporation, Kariya (JP)

( * ) Notice: Subject to any disclaimer, the term of this patent is extended or adjusted under 35 U.S.C. 154(b) by 91 days.

(21) Appl. No.: 11/196,355

(22) Filed: Aug. 4, 2005

(65) Prior Publication Data

US 2006/0027900 A1   Feb. 9, 2006

(30) Foreign Application Priority Data

Aug. 6, 2004 (JP) .............................. 2004-230868
Jan. 12, 2005 (JP) .............................. 2005-005315
Mar. 24, 2005 (JP) .............................. 2005-085575

(51) Int. Cl.
*H01L 23/495* (2006.01)
(52) U.S. Cl. .................. 257/675; 257/666; 257/669; 257/E23.051
(58) Field of Classification Search ............. 257/666, 257/669, 675
See application file for complete search history.

(56) References Cited

U.S. PATENT DOCUMENTS 6,197,615 B1 * 3/2001 Song et al. ................. 438/111
7,148,564 B2 * 12/2006 Mock et al. ................ 257/696

FOREIGN PATENT DOCUMENTS

| JP | A-63-66953 | 3/1988 |
| JP | A-10-313081 | 11/1998 |
| KR | 1019970010673 B1 | 6/1997 |

OTHER PUBLICATIONS

Notice of Final Rejection from Korean Patent Office issued on Nov. 23, 2006 for the corresponding Korean patent application No. 10-2005-0071981 (a copy and English translation thereof).
Notice of Preliminary Rejection from Korean Patent Office issued on Aug. 22, 2006 for the corresponding Korean patent application No. 10-2005-0071981 (a copy and English translation thereof).

* cited by examiner

*Primary Examiner*—Nitin Parekh
(74) *Attorney, Agent, or Firm*—Posz Law Group, PLC

(57) ABSTRACT

A semiconductor device is composed of a heat sink, an IC chip mounted and fixed on a specific face of the heat sink, a lead frame electrically connected to the IC chip and a sealing mold resin package. One or more of the faces of the heat sink has a specific surface area.

10 Claims, 18 Drawing Sheets

SEMICONDUCTOR DEVICE

CROSS REFERENCE TO RELATED APPLICATIONS

This application is based upon, claims the benefit of priority of, and incorporates by reference the contents of Japanese Patent Application No. 2004-230868 filed on Aug. 6, 2004, Japanese Patent Application No. 2005-5315 filed on Jan. 12, 2005 and Japanese Patent Application No. 2005-85575 filed on Mar. 24, 2005.

FIELD OF THE INVENTION

The present invention relates to a resin-mold package type semiconductor device in which a semiconductor chip, leads and a heat sink are enclosed in a sealing resin-mold package.

BACKGROUND OF THE INVENTION

FIG. 28 is a diagram showing a schematic cross-sectional configuration of a conventional resin-mold package type semiconductor device.

An IC chip 20 is mounted on a specific face 11 of a heat sink 10, sandwiching an adhesive 30, which is made of a resin to serve as a conductive adhesive, in conjunction with the specific face 11. The IC chip 20 is electrically connected to each of leads of a lead frame 40 by a wire 50. The heat sink 10, the IC chip 20, and the lead frame 40 are sealed in a mold resin package 60, which encloses the heat sink 10, the IC chip 20, and the lead frame 40.

The heat sink 10 has the specific face 11 mentioned above, another face 12 and a side face 13 between the specific face 11 and the other face 12. The side face 13 has a protrusion (a coining) 14. By letting the protrusion 14 bite into the mold resin package 60, the strength of adhesion existing between the mold resin package 60 and the heat sink 10 can be increased.

In the semiconductor device of such a resin-mold package type, the heat sink 10 made of a material such as Cu to excellently avoid dissipation of heat in the semiconductor device is embedded.

However, in the semiconductor device of such a resin-mold package type, thermal stress due to cooling-heating cycles, a solder re-flow generated at a solder-mounting time or the like causes the heat sink 10 and the mold resin package 60 or the heat sink 10 and the resin adhesive 30 to be detached from each other with ease. This is because there is a big difference in thermal expansion coefficient between the heat sink 10 made of a metal or the like and the resins, i.e., the mold resin package 60 and the resin adhesive 30.

Then, the occurrence of such detachment raises a performance-deterioration problem caused by, among others, the fact that a crack is resulted in at a relatively early time in the mold resin package 60 due to a thermal shock and the fact that thermal and electrical resistances between the IC chip 20 and the heat sink 10 increase.

In addition, a soldering material free of Pb (Plumbum) is desirable but the fusion temperature of such a soldering material is high. Thus, when the semiconductor device described above is joined to an external substrate through a soldering material, the temperature of a solder re-flow increases from 225 degrees Celsius of the conventional soldering material containing Pb to a higher temperature in the range 240 to 260 degrees Celsius. As a result, the problem described above becomes even more serious.

SUMMARY OF THE INVENTION

In view of the above problem, it is thus an object to effectively prevent a heat sink and a mold resin package from being detached from each other in a semiconductor device comprising a semiconductor chip, a lead frame and the aforementioned heat sink, which are enclosed in the resin-mold package for sealing the semiconductor chip, the lead frame, and the heat sink.

According to a first aspect, a semiconductor device is composed of a heat sink; an IC chip mounted and fixed on a specific face of the heat sink; a lead frame provided at locations surrounding the IC chip and electrically connected to the IC chip; and a sealing mold resin package for enclosing the heat sink, the IC chip, and the lead frame, wherein: the heat sink has the specific face, another face, and a side face between the specific face, and the other face; and specific surface areas of the specific face and the side face are each 1.35 or a number greater than 1.35.

The present invention has been discovered in experiments. Results of the experiments have verified that, by setting the specific surface areas of the specific face and the side face at 1.35 or a number greater than 1.35, where the specific face and the side face are respectively a face and side face of the heat sink and the side face is a side face between the specific face and other face, which is another face of the heat sink, the strength of adhesion existing between the mold resin package and the heat sink can be increased so that the mold resin package and the heat sink can be effectively prevented from being detached from each other whereas a resin crack can be avoided.

Thus, in a semiconductor device comprising an IC chip, a lead frame, and a heat sink, which are enclosed in a resin-mold package for sealing the IC chip, the lead frame, and the heat sink, the mold resin package and the heat sink can be effectively prevented from being detached from each other.

In addition, according to a second aspect, the semiconductor device according to according to the first aspect is further characterized in that: the heat sink has a protrusion on the side face of the heat sink as a protrusion protruding out from the side face; and a member existing on the side face of the heat sink at a location between the protrusion and a border between the specific face and the side face has a specific surface area of 1.35 or a number greater than 1.35.

With the protrusion provided on the side face of the heat sink as described above, it is desirable to set the specific surface area of a member existing on the side face of the heat sink at a location between the protrusion and a border between the specific face and the side face at 1.35 or a number greater than 1.35.

According to a third aspect, the semiconductor device is composed of a heat sink; an IC chip mounted and fixed on a specific face of the heat sink; a lead frame provided at locations surrounding the IC chip and electrically connected to the IC chip; and a sealing mold resin package for enclosing the heat sink, the IC chip, and the lead frame, wherein the specific surface area of at least the specific face of the heat sink is 1.35 or a number greater than 1.35.

The present invention has been discovered in experiments. Results of the experiments have verified that, by setting the specific surface area of at least the specific face of the heat sink at 1.35 or a number greater than 1.35, the strength of adhesion existing between the mold resin package and the heat sink can be increased so that the mold resin package and the heat sink can be effectively prevented from being detached from each other whereas a resin crack can be avoided.

The specific face of the heat sink is a face forming most of an area of adhesion existing between the mold resin package and the heat sink. Thus, by setting the specific surface area of at least the specific face of the heat sink at 1.35 or a number greater than 1.35, the strength of adhesion existing between the mold resin package and the heat sink can be increased so that the mold resin package and the heat sink can be effectively prevented from being detached from each other whereas a resin crack can be avoided. That is, the portion, the specific surface area of which needs to be set at 1.35 or a number greater than 1.35, is only the specific face of the heat sink.

Thus, in a semiconductor device composed of an IC chip, a lead frame, and heat sink, which are enclosed in a resin-mold package for sealing the IC chip, the lead frame, and the heat sink, the mold resin package and the heat sink can be effectively prevented from being detached from each other.

According to a fourth aspect, the semiconductor device according to any one of the first to third aspects is characterized in that the IC chip is mounted and fixed on the specific face of the heat sink through an adhesive made of a resin, thereby sandwiching the adhesive in conjunction with the specific face.

Since the IC chip is mounted and fixed on the specific face of the heat sink through the adhesive made of a resin, sandwiching the adhesive in conjunction with the specific face, the heat sink and the adhesive made of a resin can be effectively prevented from being detached from each other.

In a semiconductor according to a fifth or sixth aspect, the mold resin package and the adhesive are both made of a resin of an epoxy group.

According to a seventh aspect, a semiconductor device is composed of: a heat sink; an IC chip mounted and fixed on a specific face of the heat sink; a lead frame provided at locations surrounding the IC chip and electrically connected to the IC chip; and a sealing mold resin package for enclosing the heat sink, the IC chip, and the lead frame. A portion of the heat sink is exposed to the outside of the mold resin package and a portion of the lead frame protrudes out from the mold resin package as outer leads. The specific surface area of a surface of the heat sink is set at a value in the range 1.13 to 1.32. The specific surface area of surfaces of the outer leads is set at a value in the range 1.05 to 1.20.

Such a semiconductor device is mounted typically on an external substrate by attaching the outer leads protruding out from the mold resin package as outer leads of the lead frame to lands on the external substrate by adoption of the soldering technique as shown in FIGS. 4 and 5.

In a process to mount the semiconductor device on the external substrate, the outer leads may be shifted from their correct soldering positions due to bending of the outer leads or other reasons.

In order to solve this problem, in the case of the semiconductor device according to this embodiment, a laser beam is applied to the outer leads and the external substrate from a position above the external substrate to recognize the outer leads and scan for their positional shifts on the basis of differences in reflected-light quantity.

The surfaces of the outer leads can be each made as a shiny face having a low degree of roughness so that, by increasing the reflected-light quantity of the outer leads, the lead recognizability can be improved. However, inner leads of the lead frame are created in the same process as the outer leads and the low roughness degree of the inner leads results in poor adhesion existing between the inner leads and the mold resin package.

Conversely speaking, in order to assure the strength of adhesion existing between the inner leads and the mold resin package, the roughness of the inner leads and, hence, the roughness of the outer leads must be increased to give a high specific surface area. In this way, it is possible to assure the strength of adhesion existing between the inner leads and the mold resin package but the reflected-light quantity of the outer leads inadvertently decreases due to the increased degree of roughness. As a result, the lead recognizability of the outer leads becomes insufficient.

From this point of view, a study was further carried forward to find out a surface roughness that assures both the lead recognizability of the outer leads and the strength of adhesion existing between the inner leads and the mold resin package. The strength of adhesion existing between the inner leads and the mold resin package is assured of course for the purpose of avoiding detachment of the heat sink and the mold resin package from each other. In addition, the surface roughness of the heat sink was studied by taking also the following points into consideration.

In a semiconductor device of this type, a portion of the heat sink is exposed to the outside of the mold resin package, forming a structure assuring heat radiation from the heat sink. In a process to create the mold resin package of such a semiconductor device, however, resin burrs are stuck on an exposed portion of the heat sink, raising a problem that the heat radiation is obstructed.

When the exposed portion of the heat sink is roughened in order to prevent the heat sink from being detached from the mold resin package, in particular, the quantity of generated resin burrs is maximized adversely and the strength of adhesion of the resin burrs to the exposed portion of the heat sink also increases so that the resin burrs become difficult to remove.

By setting the specific surface area of the heat sink in a semiconductor device according to the seventh aspect at a value in the range 1.13 to 1.32 in accordance with data shown in FIG. 27 as results of a study conducted by inventors of the present invention, it is possible to assure an adhesion strength, which is large enough for preventing the mold resin package and the heat sink from being detached from each other, while properly avoiding formation of resin burrs on the exposed portion of the heat sink.

When the specific surface area of the heat sink is set at a value smaller than 1.13, the adhesion strength is not large enough for preventing the mold resin package and the heat sink from being detached from each other so that the mold resin package and the heat sink can be detached from each other with ease. When the specific surface area of the heat sink is set at a value greater than 1.32, on the other hand, the strength of adhesion becomes excessively large, causing resin burrs to be generated on the exposed portion of the heat sink and difficult to remove.

In addition, by setting the specific surface area of the outer leads in a semiconductor device according to the seventh aspect at a value in the range 1.05 to 1.20 in accordance with the data shown in FIG. 27, it is possible to assure both a sufficient lead recognizability of the outer leads and a sufficient strength of adhesion existing between the inner leads and the mold resin package since the specific surface area of the inner leads is about the same as the specific surface area of the outer leads.

When the specific surface area of the outer leads is set at a value smaller than 1.05, the specific surface area of the inner leads will also be set at a value smaller than 1.05 as well so that the strength of adhesion existing between the inner leads and the mold resin package is not large enough for preventing the mold resin package and the inner leads from being detached from each other. As a result, the mold resin package and the inner leads can be detached from each other with ease.

By setting the specific surface area of the outer leads in a semiconductor device according to the seventh aspect at a value in the range 1.05 to 1.20, on the other hand, the adhesion existing between the inner leads and the mold resin package can be assured at a specific surface area smaller than the specific surface area for assuring the adhesion existing between the heat sink and the mold resin package.

When the specific surface area of the outer leads is set at a value greater than 1.20, however, the quantity of light reflected by the outer leads is not sufficient so that the lead recognizability of the outer leads cannot be assured.

In accordance with the seventh aspect, in the semiconductor device comprising the heat sink, the IC chip, the lead frame, and the sealing mold resin package for enclosing the heat sink, the IC chip and the lead frame, the specific surface area of the surface of the heat sink is set at a value in the range 1.13 to 1.32 and the specific surface area of the surfaces of the outer leads is set at a value in the range 1.05 to 1.20 so that the semiconductor device is capable of assuring a sufficient adhesion strength, which is large enough for effectively avoiding detachment of the heat sink and the mold resin package from each other, while properly preventing resin burrs from sticking on the exposed other face of the heat sink as well as implementing both the recognizability of the outer leads and the strength of adhesion existing between the inner leads and the mold resin package.

According to an eighth aspect, the semiconductor device according to the seventh aspect may have a configuration in which the heat sink has a protrusion protruding from a surface of the heat sink, and the protrusion bites into the mold resin package. Thus, the strength of adhesion existing between the mold resin package and the heat sink can be increased.

According to a ninth aspect, the semiconductor device according to the seventh or eighth aspect can have a configuration in which the IC chip is attached and fixed on the heat sink through an adhesive made of a resin, sandwiching the adhesive in conjunction with the heat sink.

According to a tenth aspect, the semiconductor device according to the ninth aspect can have a configuration in which the adhesive is made of a resin of an epoxy group.

According to an eleventh aspect, the semiconductor device according to any one of the seventh to tenth aspects may have a configuration in which the mold resin package is made of a resin of an epoxy group.

DETAILED DESCRIPTION OF THE PREFERRED EMBODIMENTS

Figure 1A:
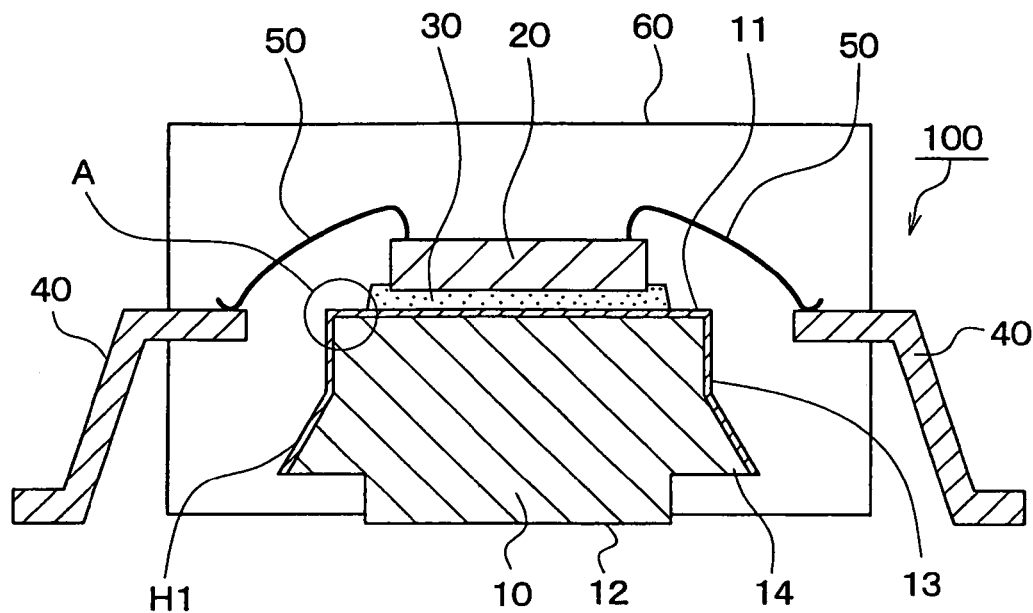
FIG. 1A is a diagram showing a schematic cross-sectional configuration of a semiconductor device of a resin mold package type according to a first embodiment.

Embodiments will be explained in reference to the drawings. It is to be noted that, in the following description, identical or equivalent members in the figures are denoted by using the same reference numerals throughout the figures in order to make explanations simpler.

First Embodiment

Figure 1B:
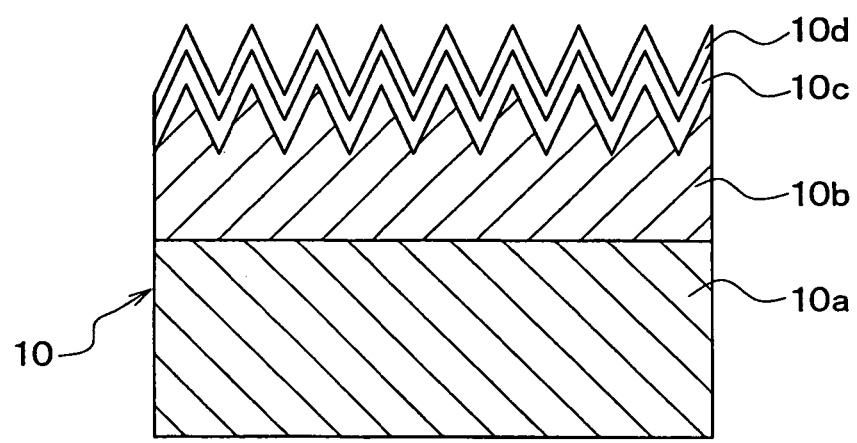
FIG. 1B is an enlarged diagram showing a portion A of FIG. 1A.

FIG. 1A is a diagram showing a schematic cross-sectional configuration of a semiconductor device 100 of an ordinary resin-mold package type according to a first embodiment. FIG. 1B is an enlarged diagram showing an A portion enclosed in a circle shown in FIG. 1A. The semiconductor device 100 can be applied to for example a QFP (Quad Flat Package) and an SOP (Small Outline Package).

A heat sink 10 is made of a material having an excellent heat-radiation characteristic. An example of such a material is a metal such as Cu, Fe, Mo, the 42 alloy and Kovar. Typically, the heat sink 10 has the form of a rectangular plate. In this embodiment, the heat sink 10 is a plate made of Cu.

In addition, as shown in FIG. 1A, the heat sink 10 has a specific face 11, another face 12, and a side face 13 between the specific face 11 and the other face 12. On the top of that, the side face 13 has a protrusion (a coining) 14 for increasing the strength of adhesion existing between a mold resin package 60 and the heat sink 10. The heat sink 10 having such a protrusion 14 can be created in a press fabrication process or the like.

An IC chip 20 serving as a semiconductor chip is mounted on the specific face 11 of the heat sink 10. The IC chip 20 is made of a silicon substrate. In the IC chip 20, devices such as transistors are created by adoption of a semiconductor process technology.

In this embodiment, the IC chip 20 is firmly attached to the specific face 11 of the heat sink 10 through an adhesive 30, which is made of a resin, sandwiching the resin adhesive 30 in conjunction with the specific face 11.

The adhesive 30 is made of a resin having an excellent thermal conductivity. Examples of the resin having an excellent thermal conductivity are a resin of the epoxy group, a polyimide resin, and a resin of the silicon group. To put it concretely, the adhesive 30 is made of an electrically conductive adhesive. In this embodiment, the adhesive 30 is made of silver paste composed of an Ag filler mixed with the resin of the epoxy group.

Placed at locations surrounding the heat sink 10, a lead frame 40 comprises leads each made of a metal such as Cu or a compound metal called the 42 alloy. The IC chip 20 and the lead frame 40 are joined to each other, being electrically connected to each other by wires 50 each made of a metal such as gold or aluminum.

Then mold resin package 60 encloses the heat sink 10, the IC chip 20, the lead frame 40, and the wires 50, sealing the heat sink 10, the IC chip 20, the lead frame 40, and the wires 50. The other face 12 of the heat sink 10 is exposed to the outside of the mold resin package 60 to enhance radiation of heat from the heat sink 10.

The mold resin package 60 is made of an ordinary mold material such as the resin of the epoxy group. In this embodiment, the mold resin package 60 is made of the epoxy-group resin, which contains a filler such as silica for typically the purpose of adjusting the thermal expansion coefficient.

In the case of such a semiconductor device 100, in this embodiment, in order to assure the strength of adhesion existing between the heat sink 10 and the mold resin package 60 as well as the strength of adhesion existing between the heat sink 10 and the adhesive 30 also made of a resin, the specific face 11, and the side face 13 between the specific face 11 and the other face 12 has a specific surface area of 1.35 or a number greater than 1.35 where the specific face 11, the other face 12, and the side face 13 are faces of the heat sink 10.

To put it concretely, in this embodiment, as shown in FIG. 1A, the heat sink 10 has a protrusion 14 on the side face 13 as a protrusion protruding out from the side face 13. A member existing on the side face 13 of the heat sink 10 at a location between the tip of the protrusion 14 and a border between the specific face 11 and the side face 13 has a specific surface area of 1.35 or a number greater than 1.35.

A member pertaining to the heat sink 10 as a member having a specific surface area of 1.35 or a number greater than 1.35 is shown as a portion hatched by hatching lines H1 in FIG. 1A. In the heat sink 10, preferably at least the surface of the member H1 as a surface with a specific surface area of 1.35 or a number greater than 1.35.

To put it concretely, in order to set a specific surface area of 1.35 or a number greater than 1.35 on the heat sink 10, the surface of the heat sink 10 needs to be made coarse.

In this embodiment, as shown in FIG. 1B, the surface of the heat sink 10 is subjected to a plating process. On a base material 10a of the heat sink 10, a roughened Ni plate 10b, a thin Pd plate 10c, and a thin Au plate 10d are created sequentially one after another. In this embodiment, the base material 10a is made of Cu.

The shape of the surface of the roughened Ni plate 10b is covered with successive films of the thin Pd plate 10c and the thin Au plate 10d, which are placed over the heat sink 10 in such a way that the uppermost surface of the plate films (that is, the surface of the heat sink 10) has a coarse shape.

Such a heat sink 10 can be created by application of a press fabrication process to the base material 10a to form the shape of the heat sink 10 and then applying a plating process to the surface of the base material 10a piece by piece or continuously for a number of successive pieces of the heat sink 10.

A method for roughening the plate films 10b, 10c, and 10d is a generally known method. In a process of creating the film of the roughened Ni plate 10b as part of an electrolysis plating process or a non-electrolysis plating process, for example, the surface of the roughened Ni plate 10b can be roughened by typically adjusting a current density or the composition of a drug solution used in the process.

As described above, as a method of roughening the surface of a plate, the process adopts a method by which the plating conditions such as the current density and the composition of a plating liquid are devised in an electrolysis plating process or a non-electrolysis plating process. In place of this method, however, the surface of a plate can be roughened by carrying out etching and/or sand-blasting processes after a plating process.

It is to be noted that the method of roughening the heat sink 10 in this embodiment can be a method other than the method, which has been described above as a method of roughening the surface of a plate. Other methods of roughening the heat sink 10 are explained by referring to FIGS. 2A-2B as follows.

Figure 2A:
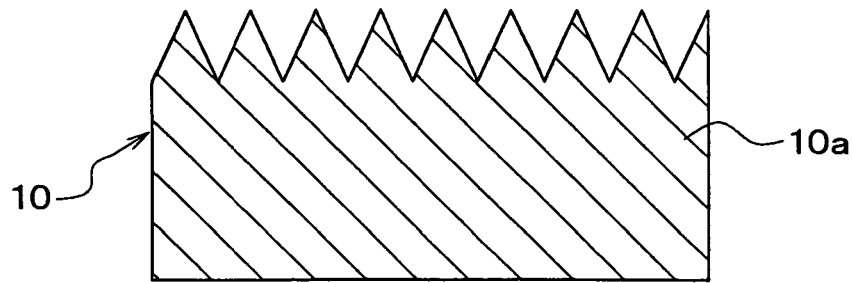
FIGS. 2A-2B are diagrams showing a schematic cross-sectional configuration of a heat sink provided by the first embodiment to include directly roughened materials of the heat sink.
Figure 2B:
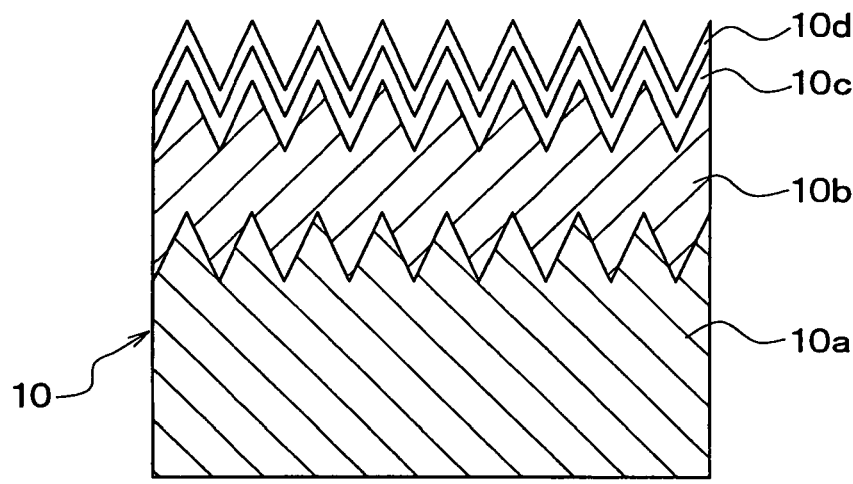

The surface-roughening methods shown in FIGS. 2A-2B are each a method of directly roughening the material of the heat sink 10. To be more specific, FIG. 2A is a diagram showing a typical surface-roughening method by which the surface of the base material 10a is roughened and no plating process is applied to the heat sink 10. On the other hand, FIG. 2B is a diagram showing a typical surface-roughening method by which the surface of the base material 10a is roughened and, then, the plates 10b, 10c, and 10d are laid over the base material 10a to create the heat sink 10.

Concrete surface-roughening methods of directly roughening the material of a heat sink include a mechanical fabrication method such as a roughening abrasion technique or a sand-blasting technique, an etching method using chemicals and a heating method using a laser beam or the like.

A film created on the surface of the base material 10a of the heat sink 10 can be a film other than a plate. Examples of the film created on the surface of the base material 10a of the heat sink 10 are an evaporation film, a CVD film, and a film created by adoption of a printing method.

Figure 3:
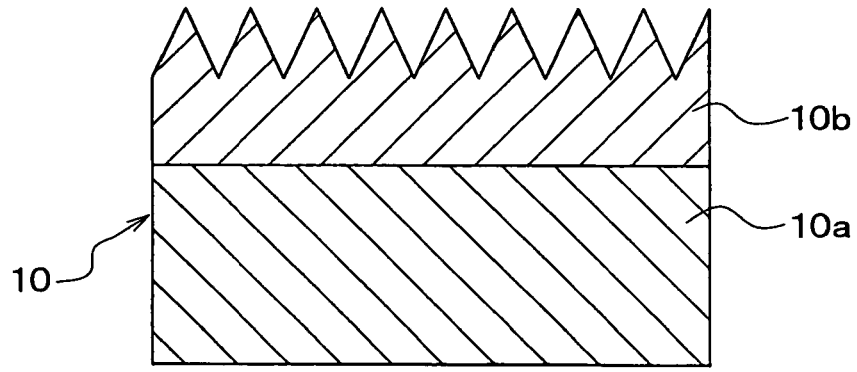
FIG. 3 is a diagram showing a schematic cross-sectional configuration of another heat sink provided by the first embodiment.

In the example shown in FIG. 1B, plates forming the surface of the heat sink 10 are 3 layers, i.e., the roughened Ni plate 10b, the thin Pd plate 10c, and the thin Au plate 10d. As shown in FIG. 3, however, a layer of the roughened Ni plate 10b only can also be created without formation of the thin Pd plate 10c and the thin Au plate 10d.

As will be described later by referring to FIGS. 4, the thin Pd plate 10c and the thin Au plate 10d are plates created for assuring a soldering characteristic in case the heat sink 10 is mounted in the semiconductor device 100 by adoption of a soldering process.

That is, the configuration of the surface of the heat sink 10 can be selected in accordance with the application of the package. When a soldering process is required, for example, solderable plates such as the Au, Ag, and Pd plates are created.

As will be described later by referring to FIG. 5, on the other hand, when it is not necessary to create a functional film on the surface of the heat sink 10, only one layer of the roughened Ni plate 10b can also be created without formation of the thin Pd plate 10c and the thin Au plate 10d as shown in FIG. 3. In addition, in this case, as an alternative, it is also possible to roughen only the base material 10a of the heat sink 10 as shown in FIG. 2A.

After the heat sink 10 with a roughened surface and the lead frame 40 are crimped, welded and bonded to form a firm single body in the semiconductor device 100, the IC chip 20 is mounted on the heat sink 10 through the adhesive 30 made of a resin, sandwiching the resin adhesive 30 in conjunction with the heat sink 10, and a wire-bonding process is carried out to connect the IC chip 20 to the lead frame 40. Then, a resin-molding process is carried out and the lead frame 40 is finally formed by performing a cutting process and other processes to eventually obtain the semiconductor device 100.

Figure 4:
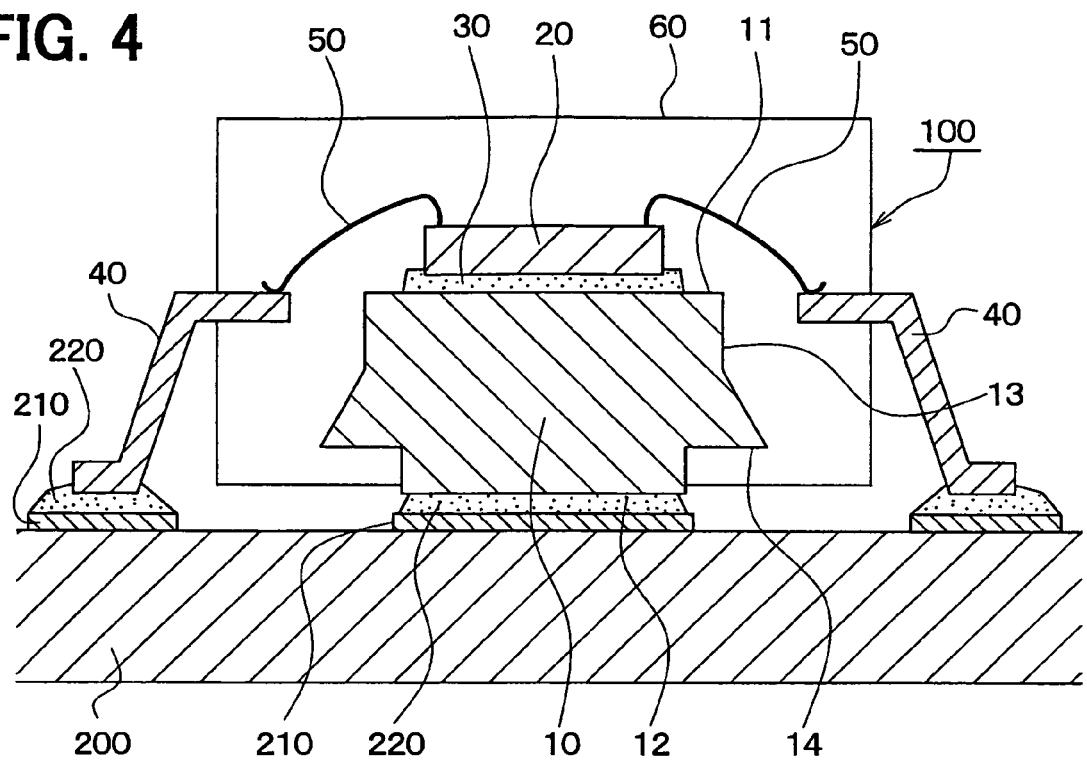
FIG. 4 is a diagram showing a schematic cross-sectional configuration in which the semiconductor device shown in FIG. 1A is mounted on an external substrate.

Then, as shown in FIG. 4, the semiconductor device 100 is placed and mounted on an external substrate 200. The external substrate 200 is typically a ceramic printed substrate. The lead frame 40 is placed on lands 210 provided on the external substrate 200.

Subsequently, portions of the lead frame 40 are extruded from the mold resin package 60 of the semiconductor device 100. The extruded portions referred to as outer leads are joined to their respective lands 210 on the external substrate 200 through soldering stuffs 220 each sandwiched between an outer lead and a land 210.

The other face 12 of the heat sink 10 is also joined to a land 210 through a solder 220 sandwiched between the other face 12 and the land 210. Thus, in the mounting structure shown in FIG. 4, heat is properly radiated from the other face 12 of the heat sink 10 to the external substrate 200.

In this embodiment, the soldering stuffs 220 are each a Pb-free soldering material essentially containing no Pb. In consequence, the temperature of a solder re-flow increases from 225 degrees Celsius of the conventional soldering material containing Pb to a higher temperature in the range 240 to 260 degrees Celsius.

As the actual Pb-free soldering stuff, for example, a soldering material of an Sn—Ag (Ag 3.5) group or a soldering material of an Sn—Ag—Cu group can be used in the soldering process. As the soldering material of an Sn—Ag—Cu group, a material with Ag in the range 1 to 4 and Cu in the range 0 to 1 can be used. To put it more concretely, for example, a material of 3Ag-0.5Cu or 3.5Ag-0.7Cu can be used as the soldering material of an Sn—Ag—Cu group.

Figure 5:
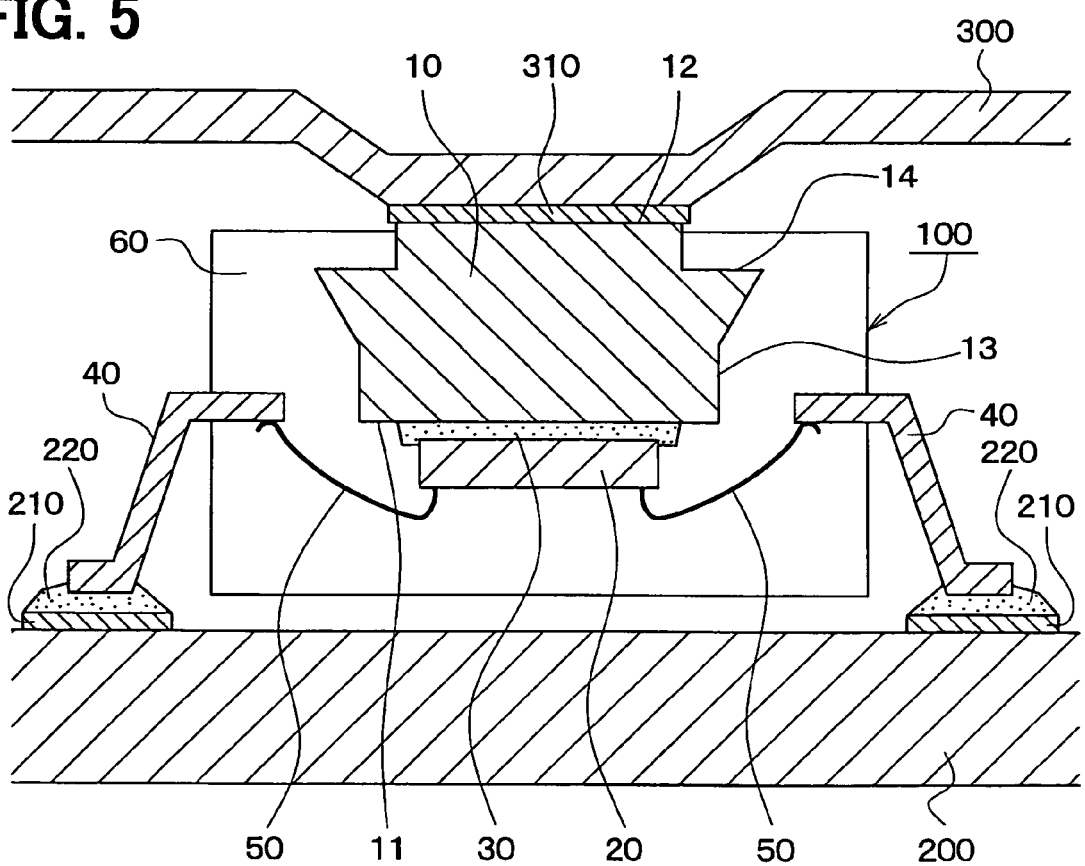
FIG. 5 is a diagram showing another schematic cross-sectional configuration in which the semiconductor device shown in FIG. 1A is mounted on an external substrate.

In addition, as shown in FIG. 5, the semiconductor device 100 can also be placed and mounted on an external substrate 200 in an upside-down orientation. In this upside-down orientation of the semiconductor device 100, the outer leads are bent toward a side opposite to the lead-bending side shown in FIGS. 1 and 4. Also in this case, the outer leads are joined to their respective lands 210 on the external substrate 200 through soldering stuffs 220 each sandwiched between an outer lead and a land 210.

On the other hand, the other face 12 of the heat sink 10 is joined to a case 300 on the opposite side of the external substrate 200 through an adhesive material 310 and a soldering stuff 220, which are sandwiched between the other face 12 and the case 300. Thus, in the mounting structure shown in FIG. 5, heat is properly radiated from the other face 12 of the heat sink 10 to the case 300.

By the way, as described above, in this embodiment, the member H1 shown in FIG. 1A as a member of the semiconductor device 100 has a specific surface area of 1.35 or a number greater than 1.35. The member H1 comprises the specific face 11 and side face 13 of the heat sink 10. A reason for setting the specific surface area of 1.35 or a number greater than 1.35 is described as follows.

First of all, a study was conducted as a study to identify a member of the heat sink 10 as a member, up to which resin detachment can be avoided. The generation frequency of a resin crack is greatly affected by the quantities of detachments between the heat sink 10 and the resins from each other. In this case, the resins are the mold resin package 60 and the adhesive 30 made of a resin. For this reason, an FEM analysis was conducted to analyze how much the stress changes due to the length of a detachment between the heat sink 10 and the mold resin package 60 as well as the length of a detachment between the heat sink 10 and the resin adhesive 30.

Results of the study and the analysis indicate that, when the detachments of the resins can be avoided throughout an area ranging from the specific face 11 of the heat sink 10 to the side face 13, the magnitude of the stress generated at the lower portion of the protrusion 14 can reduced substantially. That is, in the case of this embodiment, when the detachments of the resins can be avoided throughout an area ranging from the specific face 11 of the heat sink 10 to the upper portion of the protrusion 14, the magnitude of the stress can be decreased considerably. Thus, the prevention of the resin detachments needs to be carried out only for the area of the member H1 shown in FIG. 1A. That is, the surface of the heat sink 10 in this area needs to be roughened.

Then, inventors of the present invention paid attention to the specific surface area of the heat sink 10 as an indicator used for indicating the roughening degree of the surface of the heat sink 10.

Figure 6:
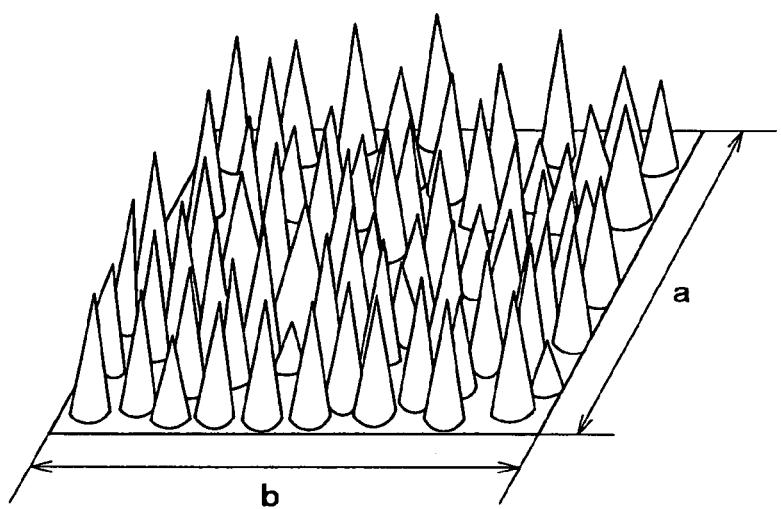
FIG. 6 is a diagram showing a model of the surface of a roughened heat sink.

This specific surface area can be measured by using an AFM (Atomic Force Microscope). FIG. 6 is a diagram showing a model of the shape of the surface of the heat sink 10 roughened by adoption of any one of the methods described before. This diagram is a diagram obtained by modeling an image resulting from observation using a scanning electron microscope.

As shown in FIG. 6, the surface of the heat sink 10 roughened by adoption of any one of the methods has an uneven shape composed of sharp triangular pyramids protruding in the upward direction. The specific surface area is defined as a ratio of the actual area of the uneven surface to the area of a flat surface of the heat sink 10.

To put it concretely, the specific surface area is defined as follows. Assume that the lengths of the sides of a rectangular area shown in FIG. 6 are a and b. In this case, the area of the flat surface with such sides is a×b. The specific surface area is defined as a quotient obtained as a result of division of the actual area of the uneven surface by the area of a×b. Such a specific surface area can be found by carrying out image processing using an atomic force microscope.

The effect of the specific surface area of the heat sink 10 on the characteristic of adhesion with the resins was studied. FIGS. 7, 8, 9, and 10 are each a diagram showing results of the study. In the study, Cu was used as a base material and the heat sink 10 roughened by plates as shown in FIG. 1B was utilized as an object of the study. Ag paste serving as the resin adhesive 30 and the mold resin package 60 was both a resin of the epoxy group.

Figure 7:
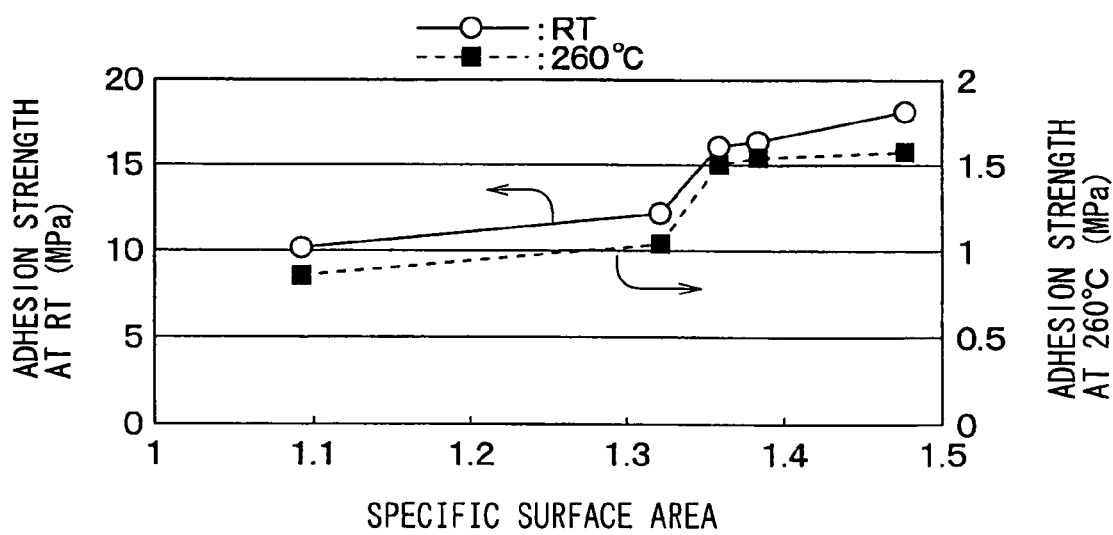
FIG. 7 is a diagram showing experimental results representing relations between the specific surface area of a heat sink and the strength of adhesion existing between the heat sink and a mold resin package enclosing the heat sink.

FIG. 7 is a diagram showing results of a study conducted to examine a relation between the specific surface area of the heat sink 10 and the strength of adhesion existing between the heat sink 10 and the mold resin package 60. The strength of the adhesion represents results of experiments conducted at a normal temperature and a temperature of 260 degrees Celsius.

In this case, a purine-cup strength taking MPa units as units is adopted as an adhesion strength for the specific surface area. The purine-cup strength is a shear strength in a state in which the mold resin package 60 having a shape resembling a purine cup is cohesively attached to the surface of the heat sink 10.

As shown in FIG. 7, at both the normal temperature and the temperature of 260 degrees Celsius, the strength of adhesion is increased substantially for the specific surface area set at values greater than 1.35 as the specific surface area of the heat sink 10.

Figure 8:
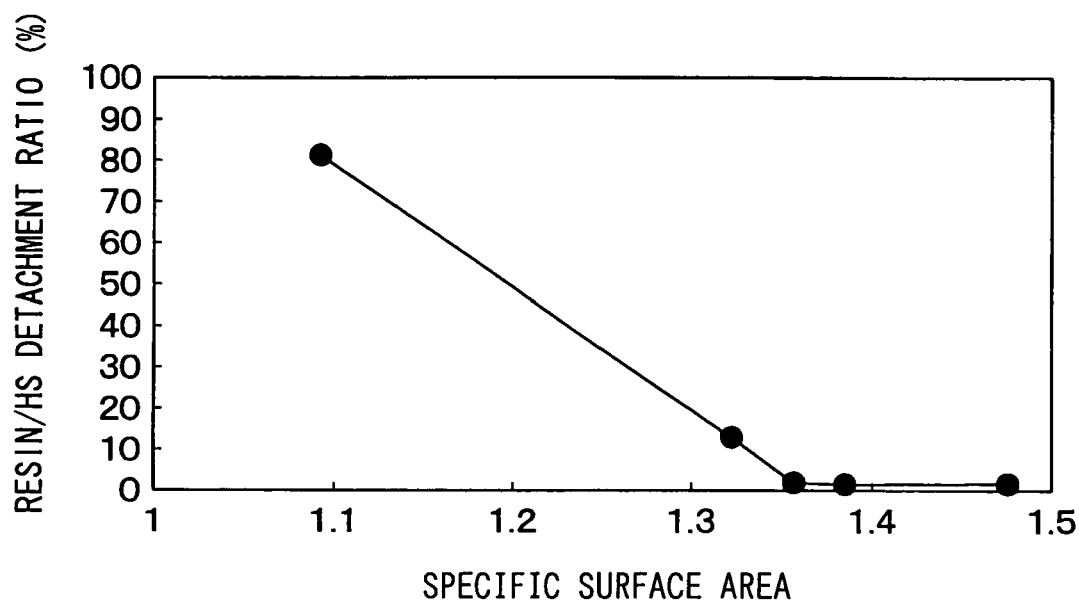
FIG. 8 is a diagram showing experimental results representing a relation between the specific surface area of a heat sink and a rate of detachment of the heat sink from a mold resin package enclosing the heat sink.
Figure 9:
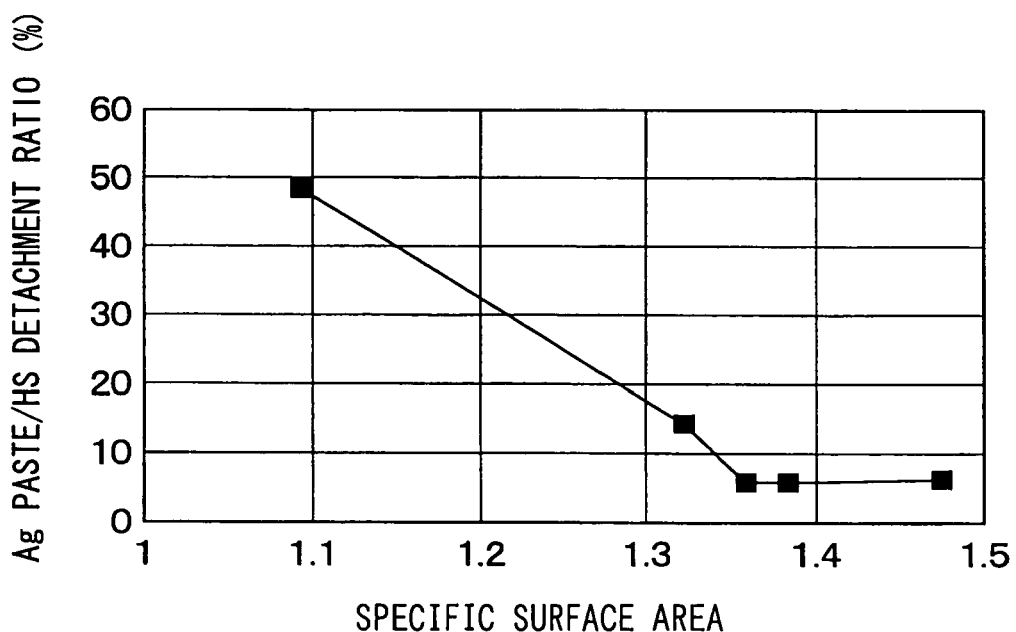
FIG. 9 is a diagram showing experimental results representing a relation between the specific surface area of a heat sink and a rate of detachment of the heat sink from an adhesive applied to the heat sink.

FIG. 8 is a diagram showing a result of a study-conducted to examine a relation between the detachment rate and the specific surface area of the heat sink 10. The detachment rate is a rate of detachment of the heat sink (HS) 10 and the mold resin package 60 from each other. Such a detachment rate is also referred to simply as a resin/HS detachment rate. On the other hand, FIG. 9 is also a diagram showing a result of a study conducted to examine a relation between the detachment rate and the specific surface area of the heat sink 10. In this case, however, the detachment rate is a rate of detachment of the heat sink 10 and the resin adhesive 30 from each other. Such a detachment rate is also referred to simply as an Ag-paste/HS detachment rate.

The study results shown in FIGS. 8 and 9 were obtained from experiments in which, after the semiconductor device 100 was subjected to a moisture absorption process carried out at a temperature of 30 degrees Celsius, at a humidity of 70% and for a period of 264 hours, the semiconductor device 100 was exposed to a temperature of 263 degrees Celsius corresponding to a re-flow temperature. Then, the state of detachment was inspected by using a SAT (an ultrasonic damage-searching apparatus).

The study results shown in FIGS. 8 and 9 verify that, in the case of a heat sink 10 having a specific surface area greater than 1.35, detachment of the mold resin package 60 and the heat sink 10 from each other as well as detachment of the resin adhesive 30 and the heat sink 10 from each other can be avoided effectively.

Figure 10:
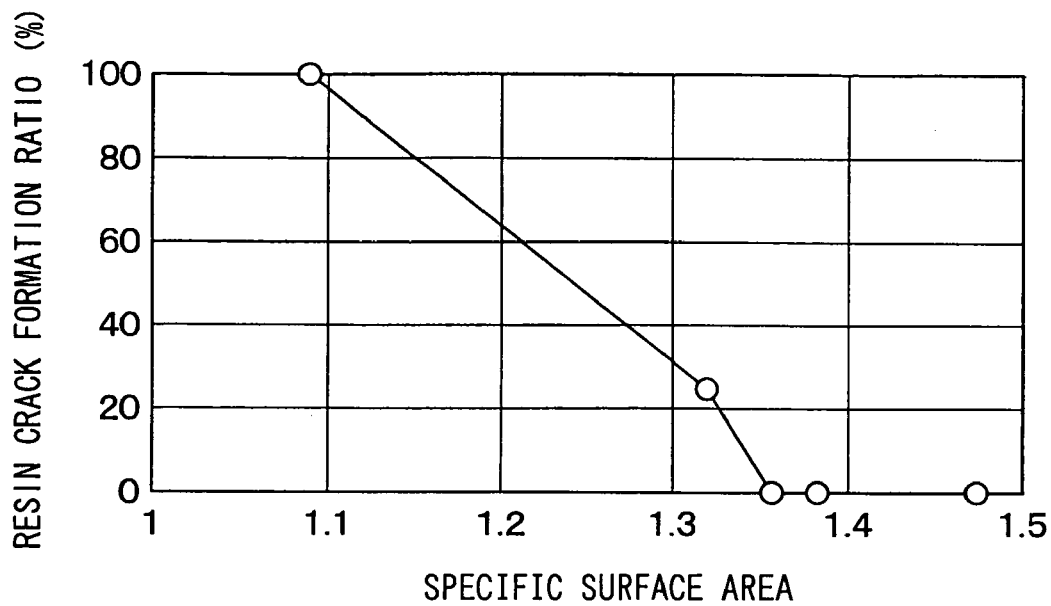
FIG. 10 is a diagram showing experimental results representing a relation between the specific surface area of a heat sink and a rate of generation of resin cracks on a mold resin package enclosing the heat sink.

FIG. 10 is a diagram showing a result of a study conducted to examine a relation between the specific surface area of the heat sink 10 and resin-crack generation rate of the mold resin package 60. The study result shown in FIG. 10 was obtained from an experiment in which, after the semiconductor device 100 was subjected to a moisture absorption process carried out at a temperature of 30 degrees Celsius, at a humidity of 70% and for a period of 264 hours, the semiconductor device 100 was exposed to a temperature of 263 degrees Celsius corresponding to a re-flow temperature before being subjected to 1,000 heating and cooling cycles at temperatures of −65 and 150 degrees Celsius. Then, the state of the resin-crack generation was inspected by using a SAT (an ultrasonic damage-searching apparatus).

As shown in FIG. 10, the rate of the resin-crack generation is 0 for specific surface areas greater than 1.35. Thus, by setting the specific surface area of the member H1 of the heat sink 10 at 1.35 or a number greater than 1.35 as described above, resin detachments can be avoided and resin cracks can be eliminated.

Then, on the basis of such experimental results, this embodiment implements a semiconductor device 100 characterized in that the semiconductor device 100 comprises:

a heat sink 10;

an IC chip 20 serving as a semiconductor chip mounted and fixed on a specific face 11 of the heat sink 10;

a lead frame 40 comprising leads provided at locations surrounding the IC chip 20 and electrically connected to the IC chip 20; and a sealing mold resin package 60 for enclosing the heat sink 10, the IC chip 20, and the lead frame 40, wherein specific surface areas of the specific face 11 and side face 13 of the heat sink 10 are each 1.35 or a number greater than 1.35.

In accordance with the semiconductor device 100 having the characteristics described above, the specific surface areas of the specific face 11 and side face 13 of the heat sink 10 are at 1.35 or a number greater than 1.35 in order to increase the strength of adhesion existing between the heat sink 10 and the mold resin package 60 and the strength of adhesion existing between the heat sink 10 and the resin adhesive 30 so that resin detachments can be avoided and resin cracks can be eliminated.

Thus, in accordance with the embodiment, in the semiconductor device 100 comprising the heat sink 10, the IC chip 20, the lead frame 40, and the sealing mold resin package 60 enclosing the heat sink 10, the IC chip 20, the lead frame 40, the detachment of the heat sink 10, and the mold resin package 60 from each other as well as the detachment of the heat sink 10 and the resin adhesive 30 from each other can be effectively avoided.

In particular, in the semiconductor device 100 according to the embodiment, as shown in FIG. 1A, the heat sink 10 has a protrusion 14 protruding out from the side face 13 of the heat sink 10. In addition, the specific surface area of a member existing on the side face 13 of the heat sink 10 between the protrusion 14 and the boundary between the side face 13 and the specific face 11 is 1.35 or a number greater than 1.35.

Modified Versions

It is to be noted, in the semiconductor device 100 shown in FIG. 1A, the IC chip 20 serving as a semiconductor chip is mounted and fixed on the specific face 11 of the heat sink 10 through the adhesive 30 made of a resin, sandwiching the resin adhesive 30 in conjunction with the specific face 11 so that the detachment of the heat sink 10 and the resin adhesive 30 from each other can be avoided effectively.

Instead of mounting the IC chip 20 on the specific face 11 of the heat sink 10 through the adhesive 30 made of a resin, sandwiching the resin adhesive 30 in conjunction with the specific face 11, the IC chip 20 can also be mounted on the specific face 11 by carrying out a soldering process.

In this case, a problem caused by the detachment of the heat sink 10 and the adhesive 30 made of a resin can be solved even though the semiconductor device 100 still does not exhibit an effect of effectively preventing the heat sink 10 and the mold resin package 60 from being detached from each other.

In addition, the semiconductor device 100 shown in FIG. 1A is implemented in a configuration applicable to for example a QFP and a SOP. However, the semiconductor devices to which the heat sink 10 according to the embodiment can be applied are not limited to particular package configurations and package sizes.

Figure 11:
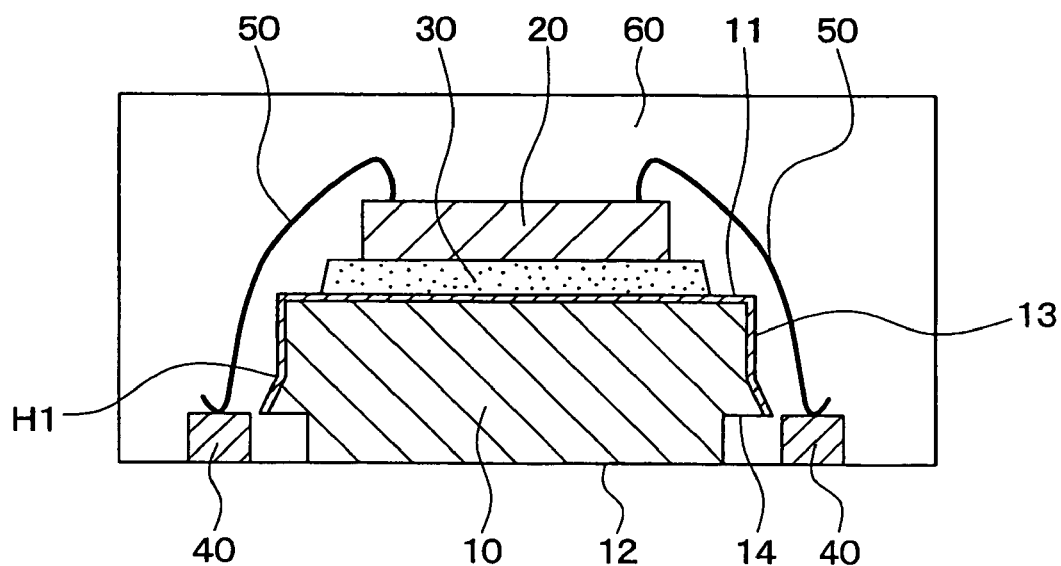
FIG. 11 is a diagram showing a schematic cross-sectional configuration of the semiconductor device having a QFN structure using a lead frame designed as a modified version of the first embodiment.

FIG. 11 is a diagram showing a schematic cross-sectional configuration of a semiconductor device having a QFN (Quad Flat Non-Leaded) package employing a lead frame to serve as a semiconductor device to which the heat sink 10 according to the embodiment can be applied.

In this case, the lead frame 40 does not have outer leads. Instead, each lead of the lead frame 40 has a half-mold structure in which the bottom face of the inner portion of the lead is exposed to the outside of the mold resin package 60.

Figure 12:
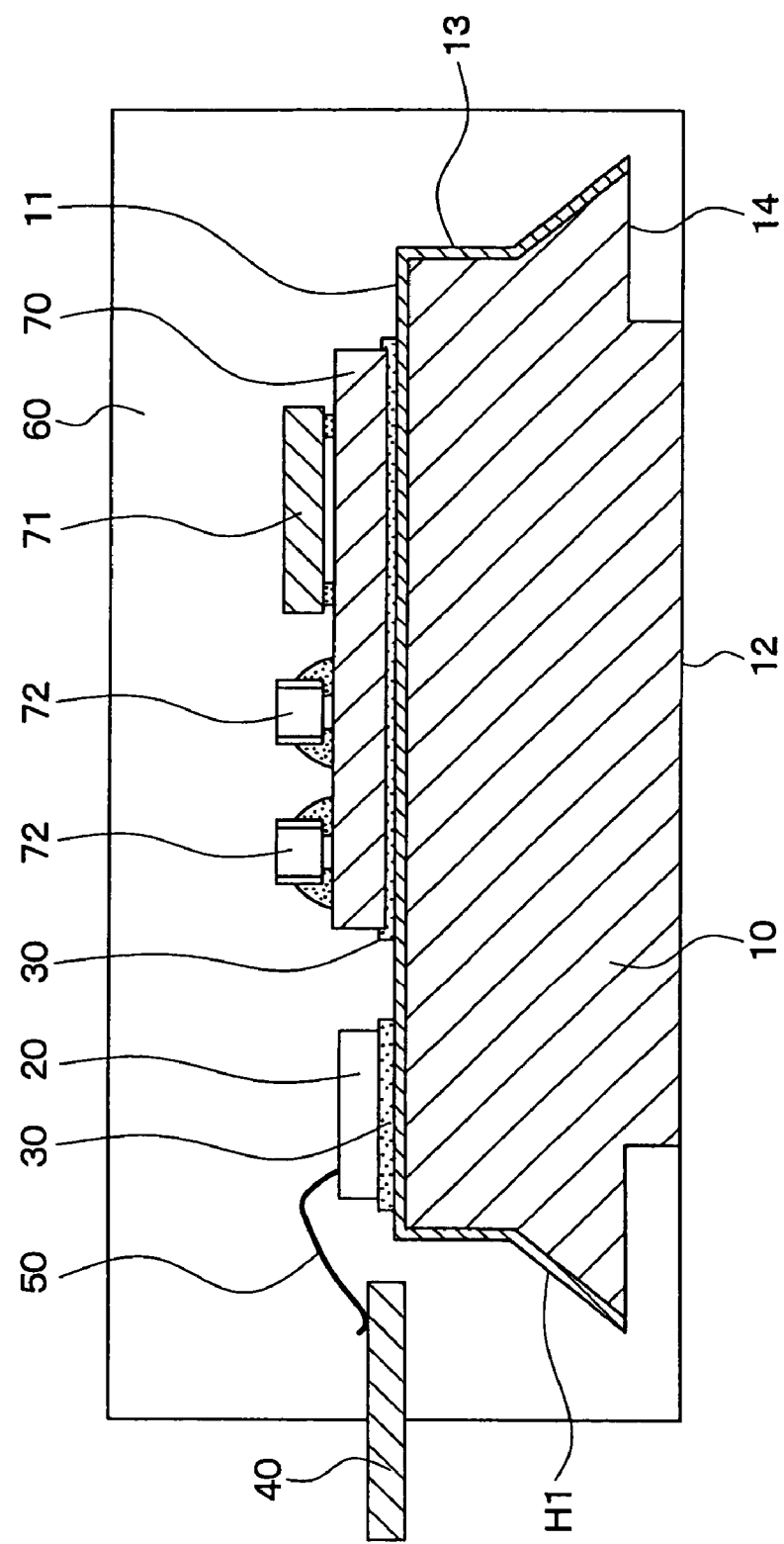
FIG. 12 is a diagram showing a schematic cross-sectional configuration of the semiconductor device used as a power module according to a modified version of the first embodiment.

FIG. 12 is a diagram showing a schematic cross-sectional configuration of a power module serving as a semiconductor device to which the heat sink 10 according to the embodiment can be applied.

In this case, in addition to the IC chip 20 is mounted on the specific face 11 of the heat sink 10 through the adhesive 30 made of a resin, sandwiching the resin adhesive 30 in conjunction with the specific face 11, a substrate 70 is also placed on the specific face 11 of the heat sink 10 through the resin adhesive 30 sandwiched between the specific face 11 and the substrate 70, which is used for mounting an IC chip 71 and chip components 72.

Also in the case of the semiconductors shown in FIGS. 11 and 12, the specific surface areas of the specific face 11 and side face 13 of the heat sink 10 are each 1.35 or a number greater than 1.35 so that the detachment of the heat sink 10 and the mold resin package 60 from each other as well as the detachment of the heat sink 10 and the resin adhesive 30 from each other can be effectively avoided.

Second Embodiment

By the way, in the case of first embodiment, the specific surface areas of the specific face 11 and side face 13 of the heat sink 10 are each 1.35 or a number greater than 1.35 as described above.

By setting the specific surface areas of the specific face 11 and side face 13 of the heat sink 10 at 1.35 or a number greater than 1.35 to roughen the specific face 11 and the side face 13, the detachment of the heat sink 10 and the mold resin package 60 from each other as well as the detachment of the heat sink 10 and the resin adhesive 30 from each other can be effectively avoided as evidenced by the relations, which have been found by carrying out experiments and shown in FIGS. 7, 8, and 9 as relations between the specific surface area, the adhesion strength and the detachment rate.

The specific face 11 of the heat sink 10 is a face forming most of an adhesion area exposed to the mold resin package 60 as well as an adhesion area exposed to the resin adhesive 30. It is thus possible to state that, by setting the specific surface area of only the specific face 11 of the heat sink 10 at 1.35 or a number greater than 1.35, an effect of avoiding the detachment of the heat sink 10 can be exhibited.

On the basis of what is described above, in accordance with a second embodiment, there is provided a semiconductor device characterized in that the semiconductor device comprises:

a heat sink 10;

an IC chip 20 serving as a semiconductor chip mounted and fixed on a specific face 11 of the heat sink 10;

a lead frame 40 comprising leads provided at locations surrounding the IC chip 20 and electrically connected to the IC chip 20; and a sealing mold resin package 60 for enclosing the heat sink 10, the IC chip 20, and the lead frame 40, wherein the specific surface area of only the specific face 11 of the heat sink 10 is 1.35 or a number greater than 1.35.

It is thus possible to verify the fact that, by setting the specific surface area of only the specific face 11 of the heat sink 10 at 1.35 or a number greater than 1.35 in accordance with this embodiment, the strength of adhesion existing between the heat sink 10 and the mold resin package 60 can be increased so that so that the detachment of the heat sink 10 and the mold resin package 60 from each other can be avoided effectively and resin cracks can be eliminated.

In addition, in the case of this embodiment, the specific surface area of only the specific face 11 of the heat sink 10 is 1.35 or a number greater than 1.35. However, the specific surface area of the side face 13 of the heat sink 10 can of course may be set at 1.35 or a number greater than 1.35 as is the case with the first embodiment described earlier.

Thus, on the basis of what is described above, it is possible to provide a semiconductor device characterized in that the semiconductor device comprises:

a heat sink 10;

an IC chip 20 serving as a semiconductor chip mounted and fixed on a specific face 11 of the heat sink 10;

a lead frame 40 comprising leads provided at locations surrounding the IC chip 20 and electrically connected to the IC chip 20; and a sealing mold resin package 60 for enclosing the heat sink 10, the IC chip 20, and the lead frame 40, wherein the specific surface area of at least the specific face 11 of the heat sink 10 is set at 1.35 or a number greater than 1.35.

Thus, by setting the specific surface area of at least the specific face 11 of the heat sink 10 at 1.35 or a number greater than 1.35, the strength of adhesion existing between the heat sink 10 and the mold resin package 60 can be increased so that so that the detachment of the heat sink 10 and the mold resin package 60 from each other can be avoided effectively and resin cracks can be eliminated.

As a result, in accordance with this embodiment, in the semiconductor comprising the heat sink 10, the IC chip 20, the lead frame 40, and the sealing mold resin package 60 enclosing the heat sink 10, the IC chip 20, and the lead frame 40, the detachment of the heat sink 10 and the mold resin package 60 from each other can be avoided effectively.

Figure 13:
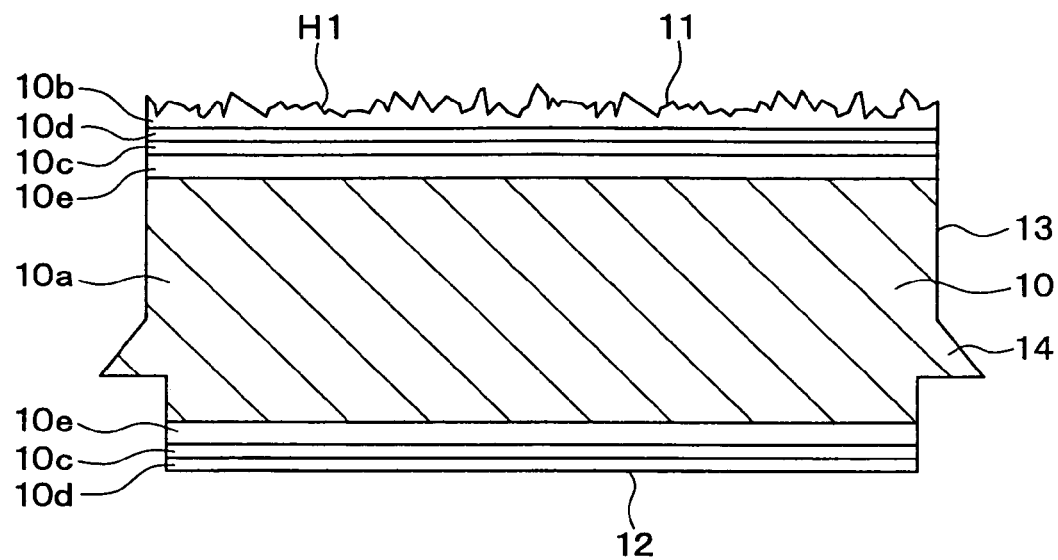
FIG. 13 is a diagram showing a schematic cross-sectional configuration of a semiconductor device according to a second embodiment.

The heat sink 10 according to such an embodiment is explained more concretely by referring to diagrams. FIG. 13 is a diagram showing a schematic cross-sectional configuration of the heat sink 10 according to the second embodiment.

In the case of this embodiment, the heat sink 10 shown in FIG. 13 is applied to the semiconductor device 100 shown in figures as a semiconductor device according to the first embodiment.

To be more specific, in accordance with this embodiment, the heat sink 10 shown in FIG. 13 replaces the heat sink 10 employed in each of the semiconductor devices shown in FIGS. 1, 4, 5, 11, and 12. For this reason, the heat sink 10 according to this embodiment is described by focusing on only differences between the heat sink 10 according to this embodiment and the heat sink 10 according to the other embodiment.

As shown in FIG. 13, in the heat sink 10 according to this embodiment, only the specific face 11 of the heat sink 10 is roughened to provide a specific surface area of 1.35 or a number greater than 1.35 so as to serve as a face used for mounting the IC chip 20 on the heat sink 10 through the adhesive 30 made of a resin, sandwiching the resin adhesive 30 in conjunction with the specific face 11.

The heat sink 10 can have an all but rectangular-plate shape similar to that of the first embodiment. The heat sink 10 comprises a base material 10a with a rectangular-plate shape between the specific face 11 and another face 12. As shown in FIG. 13, plate layers 10b, 10c, 10d, and 10e are created on the side of the specific face 11 whereas plate layers 10c, 10d, and 10e are created on the side of the other face 12.

The base material 10a is made of a metallic material of, for example, the Cu or Fe group. Typically, its plate thickness can be set at a value in the range 0.5 mm to 2 mm. The plate configuration of the base material 10a is explained as follows.

On the side of the specific face 11 of the heat sink 10, a Ni plate 10e, a thin Pd plate 10c, a thin Au plate 10d, and a roughened Ni plate 10b are created sequentially one after another on the base material 10a in an electrically plating process. The last roughened Ni plate 10b is created into such a shape that the value of the specific surface area is set at 1.35 or a number greater than 1.35.

On the side of the other face 12, on the other hand, an Ni plate 10e, a thin Pd plate 10c, and a thin Au plate 10d are created sequentially one plate after another on the base material 10a in an electrically plating process.

As for the other face 12 of the heat sink 10, its specific surface area is smaller than 1.35 to provide a relatively smooth surface. The other face 12 of the heat sink 10 is exposed to the outside of the mold resin package 60 as shown in FIG. 1A. Since the other face 12 of the heat sink 10 is a smooth face, resin burrs of the mold resin package 60 are hardly attached to the other face 12, giving excellent heat-radiation and soldering characteristics.

Assume for example that the values of the thickness of the Ni plate 10e created on both sides of the base material 10a, the thin Pd plate 10c, and the thin Au plate 10d (that is, the Ni, Pd, and Au plates) are in the ranges 0.2 microns to 2.5 microns, 0.002 microns to 0.02 microns, and 0.002 microns to 0.02 microns respectively. Also assume for example that the thickness of the roughened Ni plate 10b has a value in the range 0.2 microns to 2.5 microns.

The specific surface area of the heat sink 10 can be measured by using an AFM (Atomic Force Microscope) such as Nanopics 1000 made by Seiko Instrument Corporation.

To put it concretely, the specific surface area is found by measuring the actual surface area of a surface having typical dimensions of 10 microns×10 microns through an actual scanning operation over the surface and then dividing the actual surface area obtained as a result of the measurement by 100 square microns, which are the area of a flat surface having the same dimensions of 10 microns×10 microns.

Next, by referring to FIGS. 14 to 17, the following description explains a typical method of creating a heat sink 10 with only its specific face 11 roughened in accordance with the embodiment on the basis of a plating fabrication technique.

Figure 14:
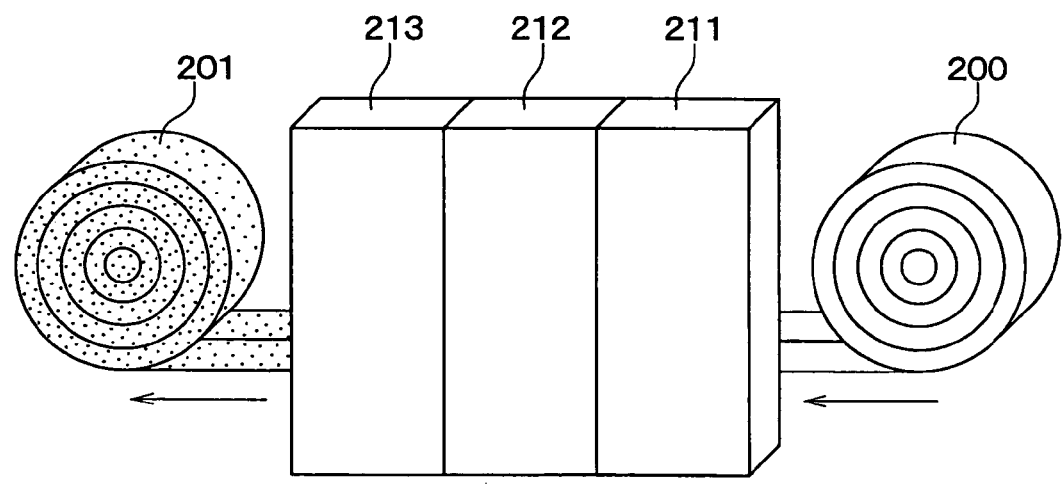
FIG. 14 is a diagram showing a method of creating Ni, Pd, and Au plates in accordance with the second embodiment.
Figure 15:
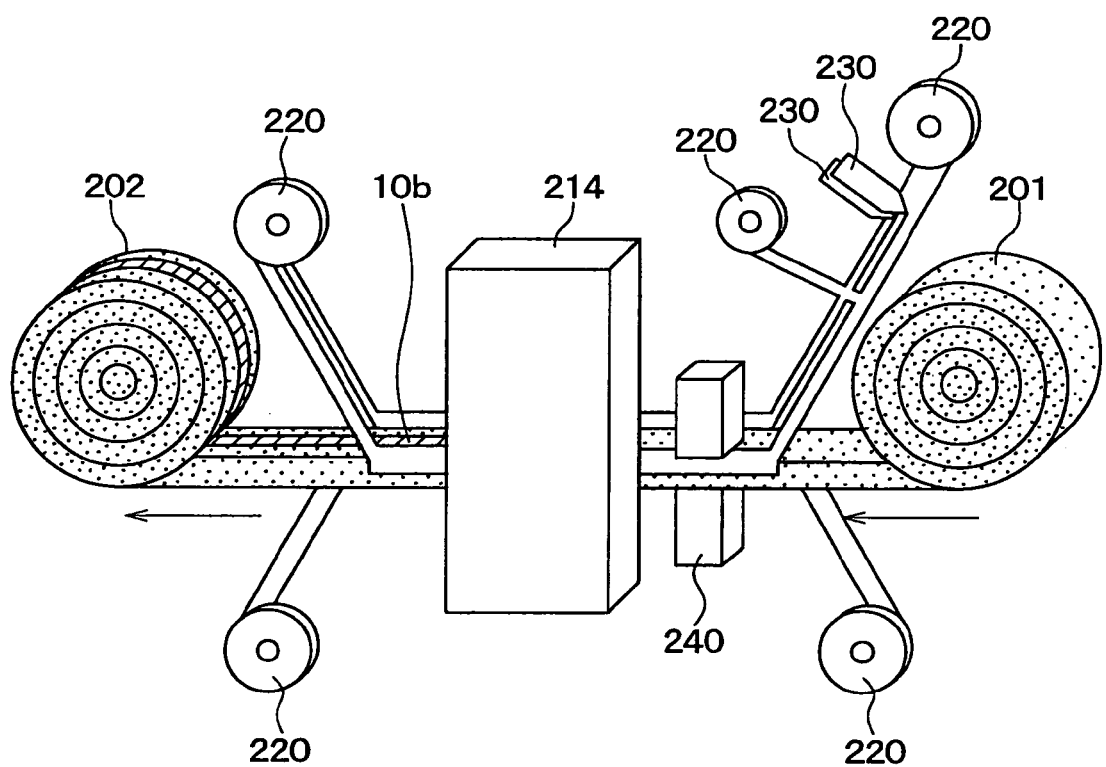
FIG. 15 is a diagram showing a method of creating a roughened Ni plate partially on the heat sink in accordance with the second embodiment.

FIG. 14 is a diagram showing a method of creating the Ni, Pd, and Au plates. FIG. 15 is a diagram showing a method of partially creating a roughened Ni plate 10b on the heat sink 10. FIGS. 16A to 16E are diagrams showing details of the method of creating a roughened Ni plate 10b on the heat sink 10. FIGS. 17A to 17E are diagrams showing a method of producing individual pieces of the heat sink 10.

In this embodiment, a plating process is carried out on a heat-sink material, which has not been cut into pieces of heat sink 10. First of all, a first coil material 200 to be used as the raw material of the heat sinks 10 is prepared.

Then, as shown in FIG. 14, while the first coil material 200 is drawn out, being supplied to an Ni-plate cistern 211, a Pd-plate cistern 212, and an Au-plate cistern 213 sequentially. On the left side of the figure, on the other hand, the base material 10a completing plating processes in the Ni plate cistern 211, the Pd-plate cistern 212, and the Au-plate cistern 213 is wounded in a coil form of a second coil material 201.

Next, as shown in FIG. 15, the second coil material 201 is masked with a tape 220 made of a resin such as the polyimide resin and, in this state, the second coil material 201 is supplied to a roughened Ni plate cistern 214. The tape 220 is cut by using a slitter 230 as a tool resembling a sword or the like as shown in the figure to leave only necessary portions of the tape 220 on the second coil material 201 as portions masking the base material 10a. The unnecessary portions of the tape 220 are removed.

Thus, on portions not masked by the tape 220, the roughened Ni plate 10b is created in a stripe form. Then, the base material 10a including the roughened Ni plate 10b created thereon is wounded in a coil form of a third coil material 202. In addition, the tape 220 serving as the mask is peeled off from the base material 10a, being wounded to form a coil.

Details of the stripe plating process are explained by referring also to FIGS. 16A-16E in addition to FIG. 15. A portion existing in the base material 10a of the heat sink 10 as a portion not to be subjected to a plating process is masked with the masking tape 220 by sticking the tape 220 on the portion. The tape 220 having a reel form is stuck on only this portion of the base material 10a by properly cutting out a portion of the tape 220 by using a sword-like tool referred to as the slitter 230 mentioned above.

Figure 16A:
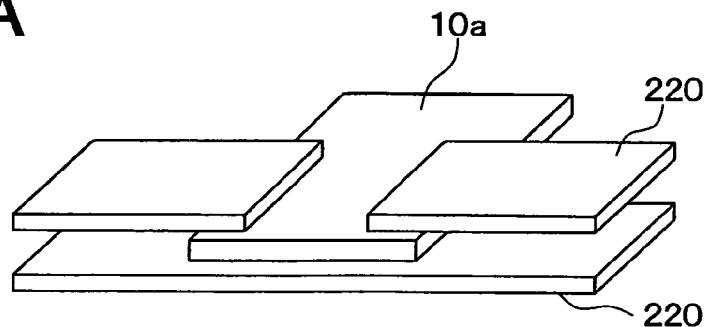
FIGS. 16A-16E are diagrams showing details of the method shown in FIG. 15 as a method of creating a roughened Ni plate.
Figure 16B:
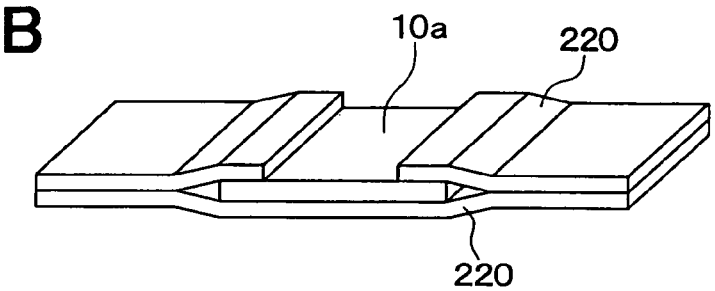

Then, the tape 220 corresponding to the portion existing in the base material 10a of the heat sink 10 as a portion to be subjected to a plating process is wound as a coil. In FIG. 15, this coil is a middle coil of the tape 220. Then, the uncut masking portion of the tape 220 is stuck on the base material 10a of the heat sink 10 in a thermal crimping process at a typical temperature of 60 degrees Celsius. The state of sticking the remaining tape 220 on the base material 10a is shown in FIGS. 16A and 16B.

A thermal crimping apparatus 240 shown in FIG. 15 is a tool for sticking the remaining tape 220 on the base material 10a in the thermal crimping process. As the thermal crimping apparatus 240, for example, a heater of an electrical conduction type can be employed.

Figure 16C:
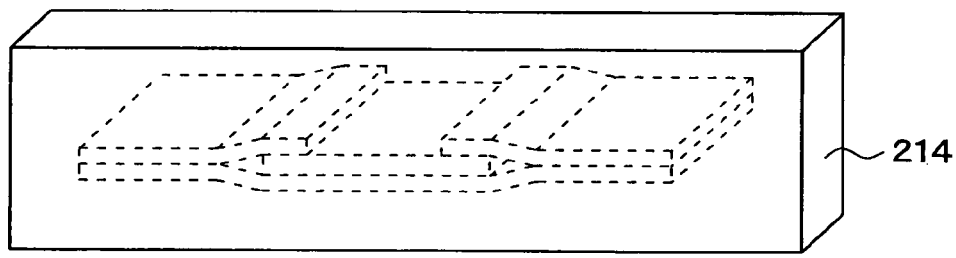
Figure 16D:
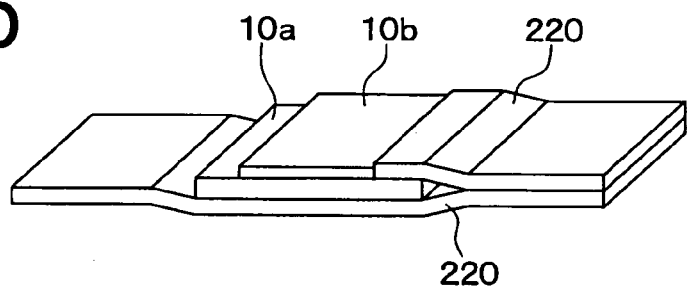
Figure 16E:
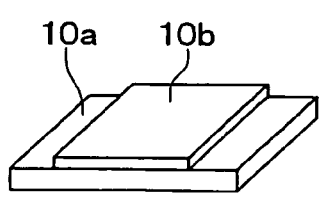

Then, as shown in FIGS. 16C and 16D, the base material 10a of the heat sink 10 is submerged into a roughened Ni plate cistern 214 and the masking tape 220 is wound. As a result, a roughened Ni plate 10b having a strip form is applied to the base material 10a to result in the third coil material 202.

Figure 17A:
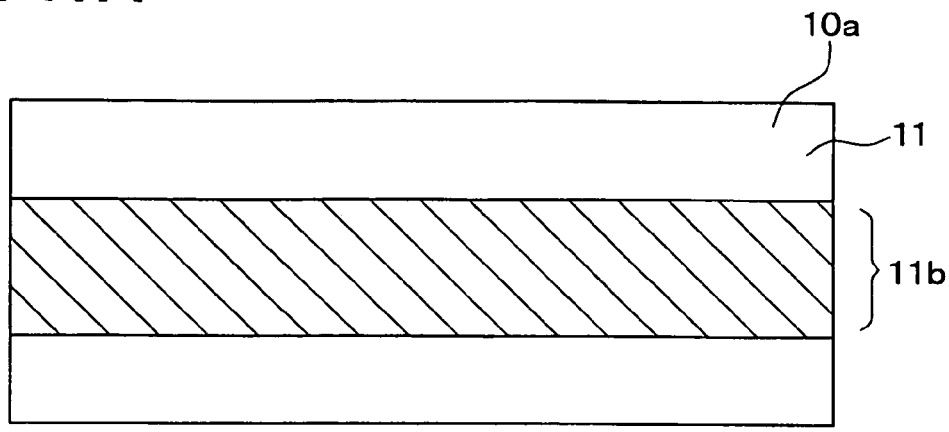
FIGS. 17A-17E are diagrams showing a method of producing individual pieces of heat sink.

As shown in FIG. 17A, the base material 10a with the roughened Ni plate 10b applied thereto as described above is subjected to a press fabrication process for creating a desired shape of the heat sink 10 so as to produce individual pieces of heat sink 10.

Figure 17B:
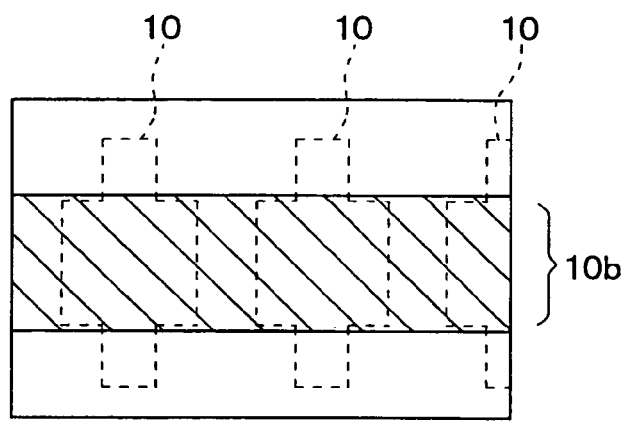
Figure 17C:
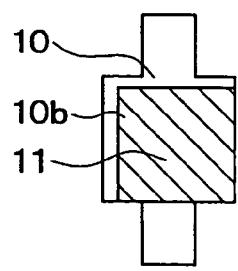
Figure 17D:
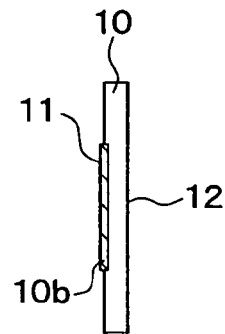
Figure 17E:
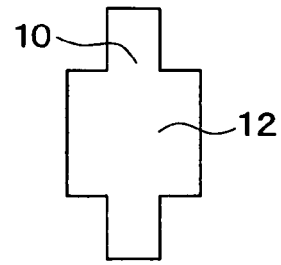

Here, FIGS. 17A to 17C are each a diagram showing a top view of the heat sink 10 as a view seen from the side of the specific face 11 of the heat sink 10. FIG. 17D is a diagram showing a side view of the heat sink 10 as a view seen from the side of the side face 13 of the heat sink 10. FIG. 17E is a diagram showing a bottom view of the heat sink 10 as a view seen from the side of the other face 12 of the heat sink 10. It is to be noted that, for the sake of convenience, the roughened Ni plate 10b is expressed as a hatched block used to identify the plate.

All the manufacturing methods described above are executed to complete the fabrication of the heat sink 10 having a plate configuration explained earlier. The stripe-plating process of the heat sink 10 conforms to the stripe-plating process of creating a lead frame from an ordinary coil material so that the existing intra structure can be utilized to carry out the partial plating process at a low cost.

It is to be noted that, while the processes shown in FIGS. 14 to 17 are masking processes using a tape, masking and plating methods using a roller rubber can also be adopted.

In addition, in this embodiment, the roughened Ni plate 10b is used to realize a specific surface area of 1.35 or a number greater than 1.35. However, as concrete roughening methods other than the plating fabrication method described above, for example, any of the evaporation technique, the spattering technique, the atmospheric-pressure CVD (Chemical Vapor Deposition) technique and the thermal spraying technique can also be adopted.

On the top of that, in the semiconductor device employing the heat sink 10 according to the embodiment, the specific face 11 of the heat sink 10 is roughened to give a specific surface area of 1.35 or a number greater than 1.35. Thus, the strength of adhesion existing between the heat sink 10 and the mold resin package 60 as well as the strength of adhesion existing between the heat sink 10 and the resin adhesive 30 can be increased to effectively avoid the detachment between the heat sink 10 and the mold resin package 60 as well as the detachment between the heat sink 10 and the resin adhesive 30 and to eliminate cracks of the resin adhesive 30 and the mold resin package 60.

Furthermore, in the case of this embodiment, the heat sink 10 has the other face 12 exposed to the outside of the mold resin package 60 but not roughened so that resin burrs are hardly generated in the mold creation process. Even when resin burrs are generated, their power of adhesion is small so that they can be eliminated with ease in typically a later process using a water jet. Thus, resin burrs that can serve as an obstruction to a soldering process do not exist on the exposed face 12 of the heat sink 10. As a result, the exposed face 12 can be attached to an external substrate or the like in a soldering process and, hence, the exposed face 12 is capable of assuring a good heat-radiation characteristic of the heat sink 10.

It is to be noted that, in this embodiment, the plating process of the heat sink 10 is carried out as the so-called pre-plating process to apply each masking plate to a heat-sink coil from a masking-plate source also having the form of a coil so that the masking plate can be applied flatly to provide a sufficient masking effect and avoid problems including masking leaks. In addition, the plating process is carried out continuously for each heat-sink coil automatically from coil to coil. Thus, the process can be carried out at a very low cost in comparison with a process performed individually piece by piece from a heat-sink piece to another.

Modified Versions

The heat sink 10 according to the embodiment roughening only the specific face 11 to provide a specific surface area of 1.35 or a number greater than 1.35 has a variety of modified versions, which are described as follows.

In the case of the typical embodiment shown in FIG. 13, an Ni plate 10e, a Pd plate 10c, an Au plate 10d, and a roughened Ni plate 10b are created on the base material 10a sequentially one plate after another on the side of the specific face 11 of the heat sink 10 whereas an Ni plate 10e, a Pd plate 10c, and an Au plate 10d are created on the base material 10a sequentially one plate after another on the side of the other face 12 of the heat sink 10.

Figure 18:
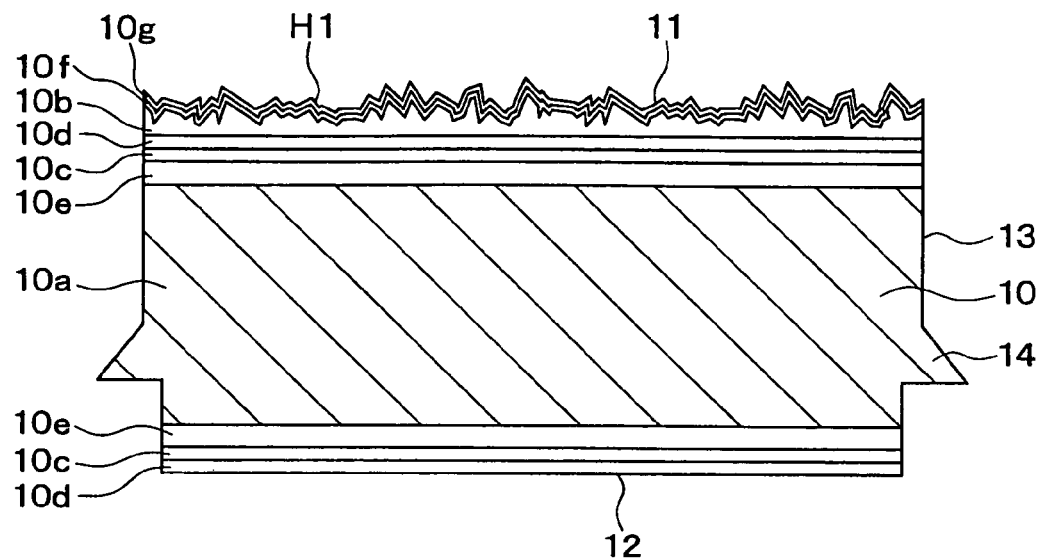
FIG. 18 is a diagram showing a schematic cross-sectional configuration of the heat sink according to a first modified version of the second embodiment.

In the case of a first modified version shown in FIG. 18, on the other hand, an Ni plate 10e, a Pd plate 10c, an Au plate 10d, a roughened Ni plate 10b, a thin Pd plate 10f, and an Au plate 10g are created on the base material 10a sequentially one plate after another on the side of the specific face 11 of the heat sink 10 whereas an Ni plate 10e, a Pd plate 10c, and an Au plate 10d are created on the base material 10a sequentially one plate after another on the side of the smooth other face 12 of the heat sink 10 to construct the same plate film configuration as the embodiment shown in FIG. 13.

In accordance with the first modified version, the thin Pd plate 10f and the Au plate 10g capable of keeping the roughness of Ni are created on the roughened Ni plate 10b sequentially one plate after another. Thus, a wire-bonding process can be applied to the specific face 11 of the heat sink 10 for the purpose of grounding or another purpose.

Figure 19:
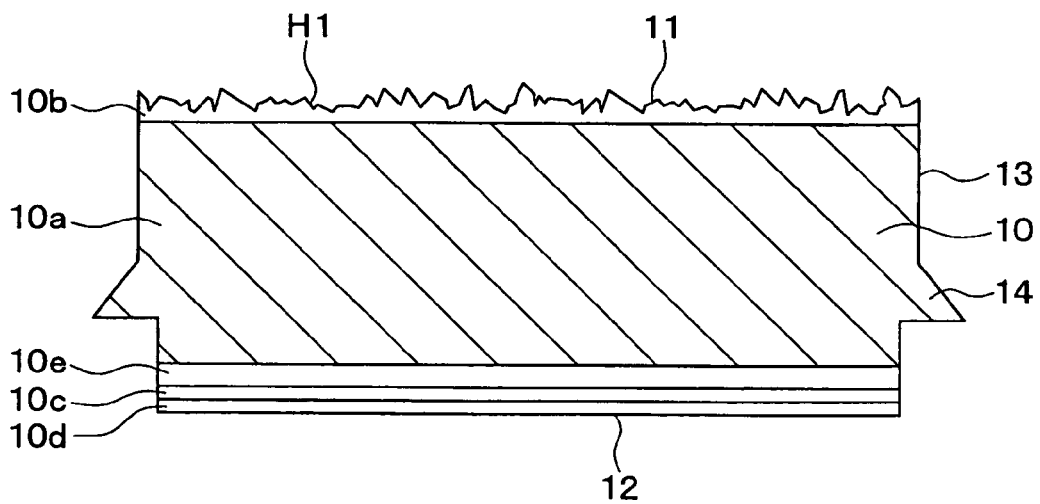
FIG. 19 is a diagram showing a schematic cross-sectional configuration of the heat sink according to a second modified version of the second embodiment.

In the case of a second modified version shown in FIG. 19, on the side of the specific face 11 of the heat sink 10, only the roughened Ni plate 10b is created on the base material 10a. On the side of the other face 12 of the heat sink 10, on the other hand, the Ni plate 10e, the Pd plate 10c, and the Au plate 10d are created on the base material 10a sequentially one plate after another to construct the same plate film configuration as the embodiment shown in FIG. 13.

A method of constructing the plate film configuration of the second modified version can be implemented when the same masking processes adopting the same method as that shown in FIG. 15 are carried out in the processing to create the Ni, Pd, and Au plates shown in FIG. 14. In this way, the amounts of used expensive metals such as Pd and Au can be reduced.

Figure 20:
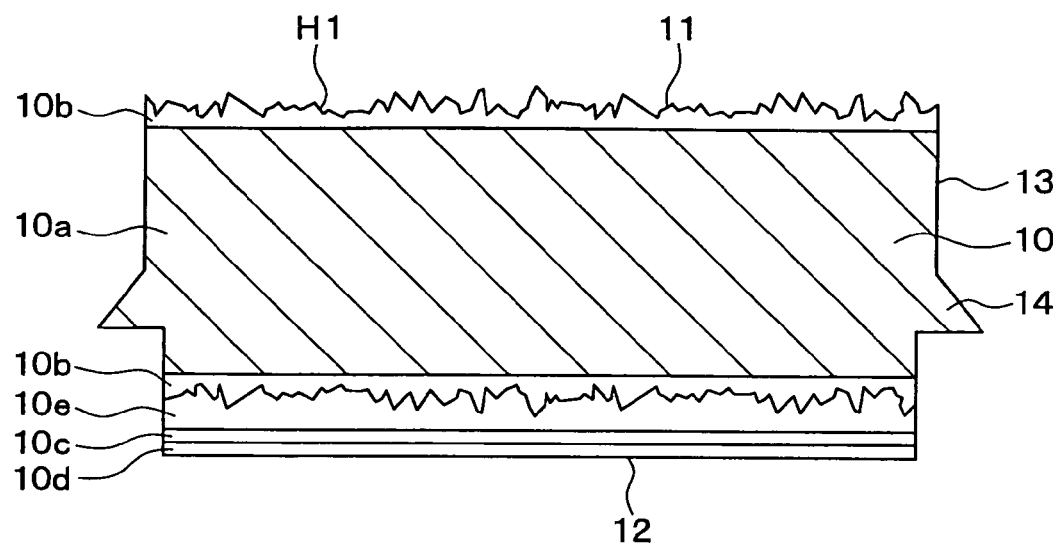
FIG. 20 is a diagram showing a schematic cross-sectional configuration of the heat sink according to a third modified version of the second embodiment.

In the case of a third modified version shown in FIG. 20, on the side of the specific face 11 of the heat sink 10, only the roughened Ni plate 10b is created on the base material 10a. On the side of the other face 12 of the heat sink 10, on the other hand, the roughened Ni plate 10b, the Ni plate 10e, the Pd plate 10c, and the Au plate 10d are created on the base material 10a sequentially one plate after another.

The third modified version adopts a concept opposite to that of the embodiment shown in FIG. 13. In the case of this third modified version, first of all, the roughened Ni plate 10b is created on the entire face of the base material 10a of the heat sink 10 by adoption of the method shown in FIG. 15.

Later on, a masking process is carried out by adoption of the method shown in FIG. 14 to make the other face 12 of the heat sink 10 an opening and then thick plates are created to eliminate the roughness of the opening.

In the case of the third modified version shown in FIG. 20, on the side of the other face 12 of the heat sink 10, the Ni plate 10e, the Pd plate 10c, and the Au plate 10d are further created on the roughened Ni plate 10b sequentially one plate after another so that the roughness of the ground layer can be eliminated.

Figure 21:
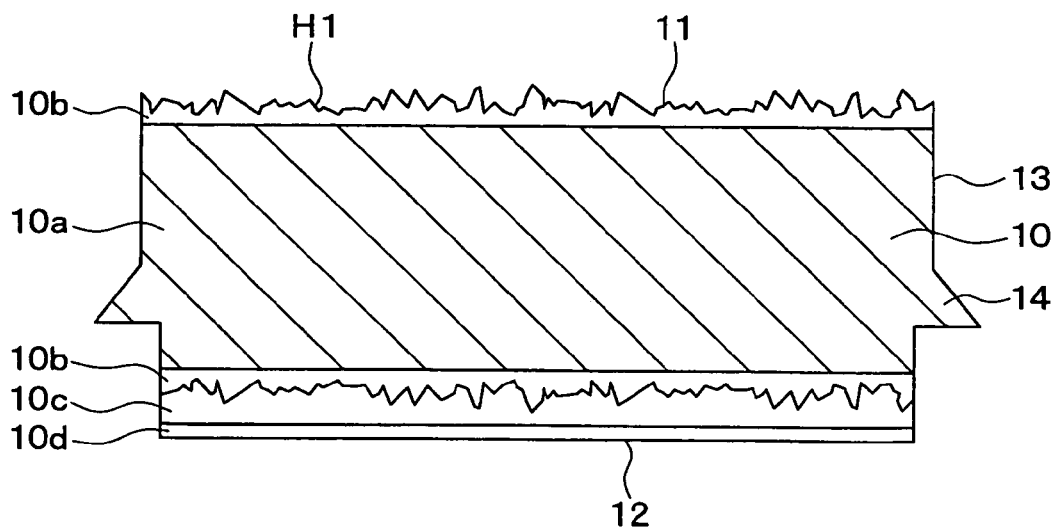
FIG. 21 is a diagram showing a schematic cross-sectional configuration of the heat sink according to a fourth modified version of the second embodiment.

In addition, a fourth modified version shown in FIG. 21 adopts the same concept as the third modified version. In the case of the fourth modified version, on the side of the other face 12 of the heat sink 10, the Pd plate 10c, and the Au plate 10d are further created on the roughened Ni plate 10b sequentially one plate after another so that the roughness of the ground layer can be eliminated.

Figure 22:
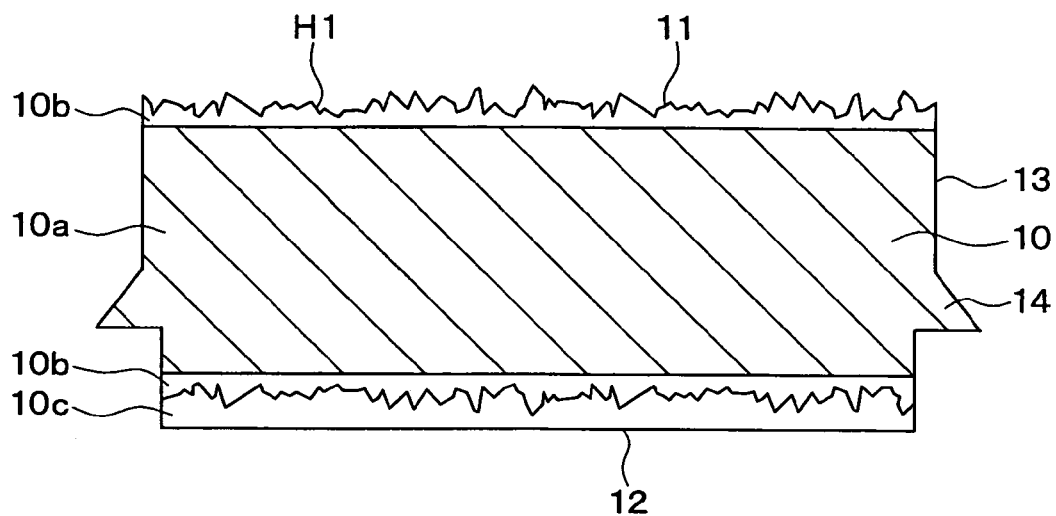
FIG. 22 is a diagram showing a schematic cross-sectional configuration of the heat sink according to a fifth modified version of the second embodiment.
Figure 23:
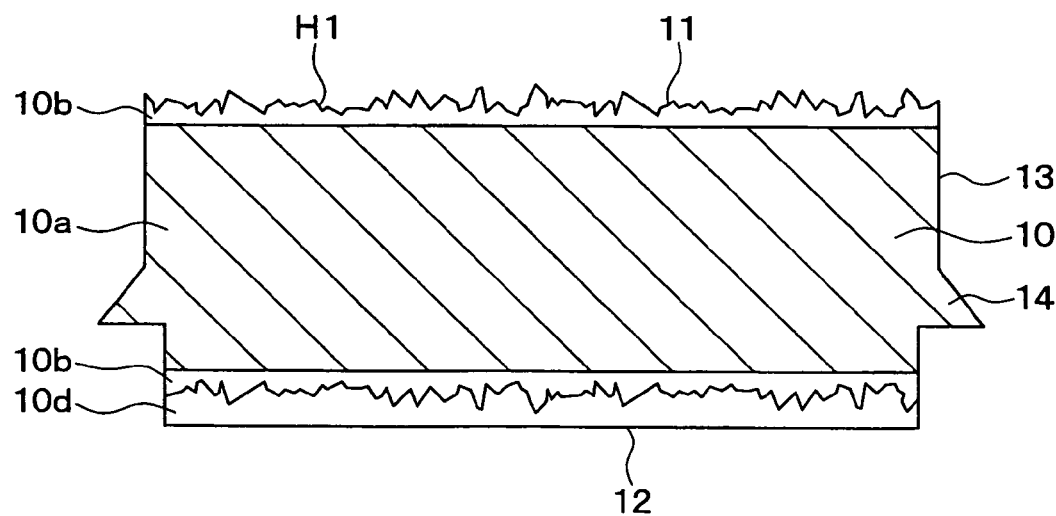
FIG. 23 is a diagram showing a schematic cross-sectional configuration of the heat sink according to a sixth modified version of the second embodiment.

A fifth fourth modified version shown in FIG. 22 and a sixth fourth modified version shown in FIG. 23 each also have the same concept as the third modified version. In the case of the fifth and the sixth fourth modified versions, on the side of the other face 12 of the heat sink 10, the Pd plate 10c, and the Au plate 10d are further created on the roughened Ni plate 10b sequentially one plate after another so that the roughness of the ground layer can be eliminated.

Figure 24:
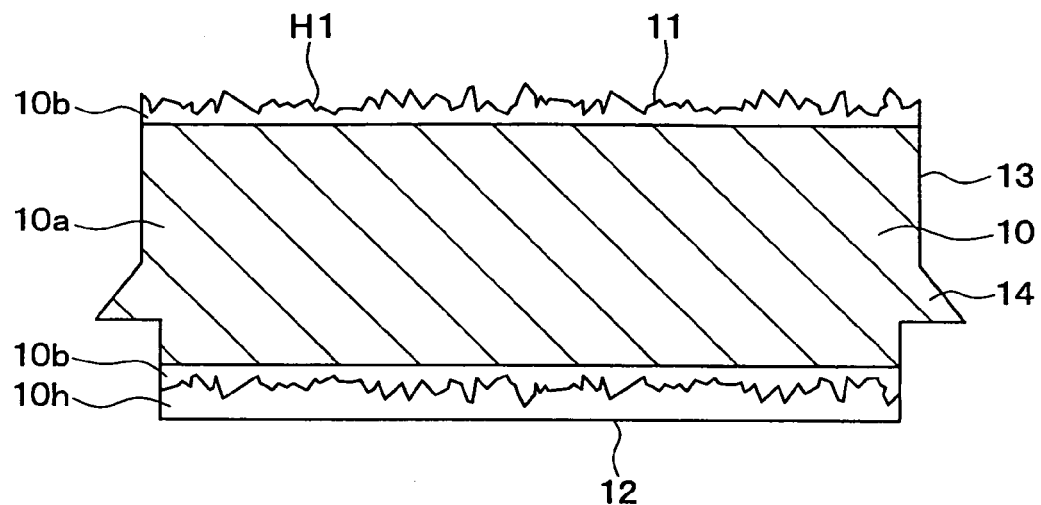
FIG. 24 is a diagram showing a schematic cross-sectional configuration of the heat sink according to a seventh modified version of the second embodiment.

A seventh modified version shown in FIG. 24 adopts the same concept as the third modified version. In the of the seventh modified version, on the side of the other face 12 of the heat sink 10, a thick plate layer 10h is further created on the roughened Ni plate 10b so that the roughness of the ground layer can be eliminated.

In the seventh modified version, as the thick plate layer 10h, an Sn plate, a solder plate, an Sn—Bi plate, an Sn—Ag plate, or an Sn—Cu plate can be created. It is not necessary to adhere to a particular combination of composition materials. That is, any combination of composition materials can be adopted as long as the combination is capable of achieving simultaneously both the two purposes, i.e., the purpose of getting rid of the roughness of the exposed other face 12 of the heat sink 10 and the purpose of making a soldering process possible.

Third Embodiment

Figure 25:
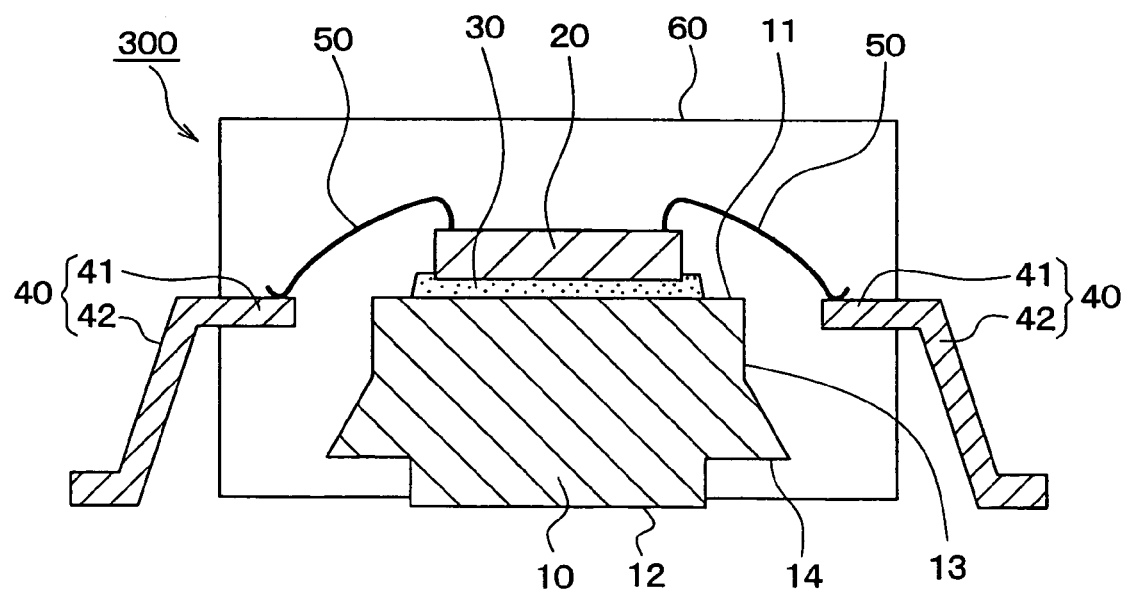
FIG. 25 is a diagram showing a schematic cross-sectional configuration of a semiconductor device of a resin mold package type according to a third embodiment.
Figure 26:
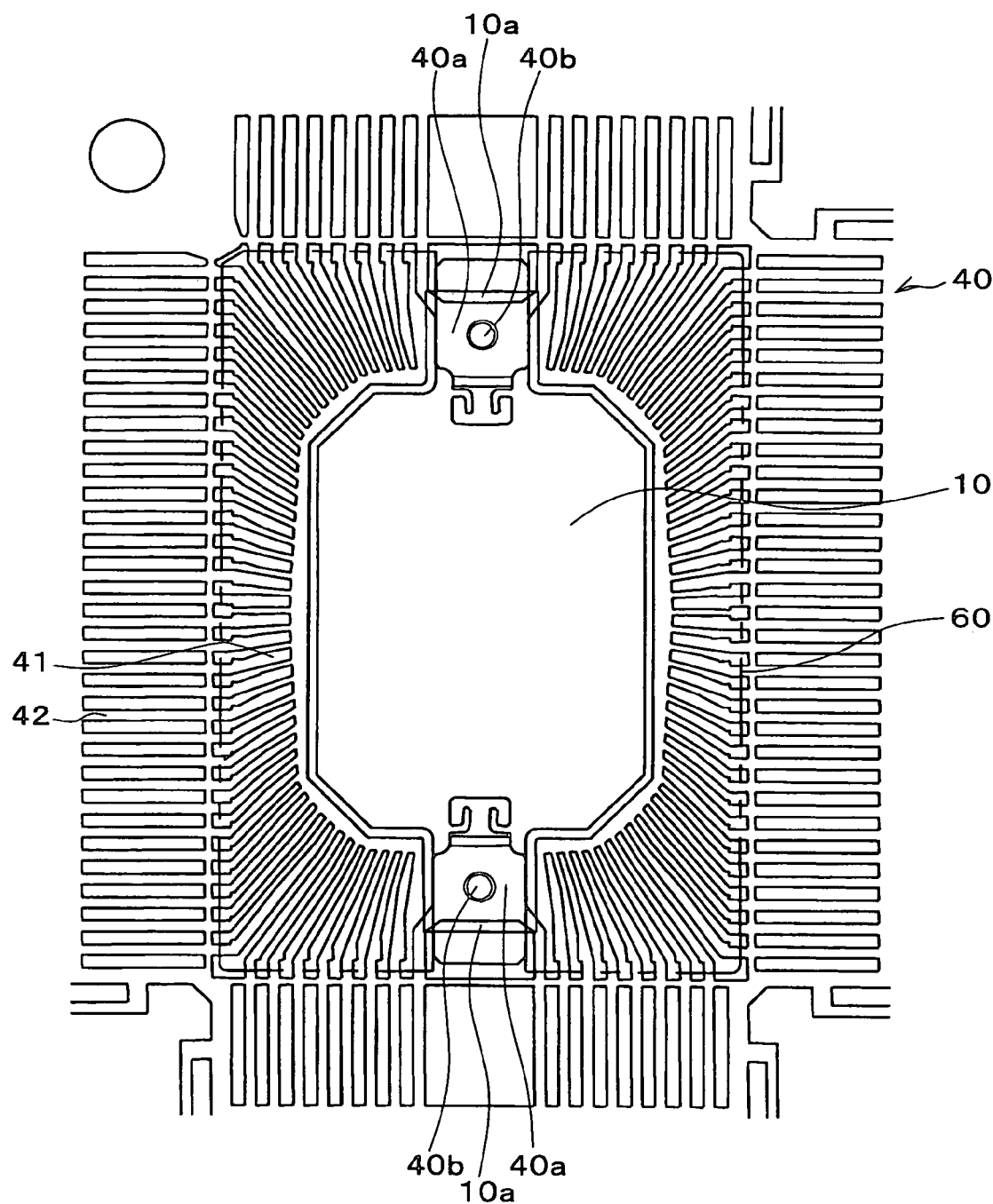
FIG. 26 is a diagram showing a schematic cross-sectional configuration of an assembly of the heat sink and the lead frame in the semiconductor device shown in FIG. 25.

FIG. 25 is a diagram showing a schematic cross-sectional configuration of a semiconductor device 300 of a resin mold package type according to a third embodiment. FIG. 26 is a diagram showing a state in which a heat sink 10 and a lead frame 40 are assembled in the semiconductor device 300. It is to be noted that a dashed line in FIG. 26 forming a rectangular shape is the outer boundary or a mold resin package 60.

The semiconductor device 300 is applicable to, for example, a QFP (Quad Flat Package) and a SOP (Small Outline Package).

The heat sink 10 is made of a material having an excellent heat-radiation characteristic. An example of such a material is a metal such as Cu, Fe, Mo, the 42 alloy, and Kovar. In this embodiment, the heat sink 10 is a plate made of Cu and, typically, the lead frame 40 has the form of a rectangular plate as shown in FIG. 26.

In addition, as shown in FIG. 25, the heat sink 10 has a specific face 11, another face 12, and a side face 13 between the specific face 11 and the other face 12. On the top of that, the side face side face 13 has a protrusion (a coining) 14 for strengthening the strength of adhesion existing between the mold resin package 60 and the heat sink 10. The heat sink 10 having such a protrusion 14 can be created in a press fabrication process or the like.

An IC chip 20 serving as a semiconductor chip is mounted on the specific face 11 of the heat sink 10. The IC chip 20 is made of a silicon substrate. In the IC chip 20, devices such as transistors are created by adoption of a semiconductor process technology.

In this embodiment, the IC chip 20 is firmly attached to the specific face 11 of the heat sink 10 through an adhesive 30, which is made of a resin, sandwiching the resin adhesive 30 in conjunction with the specific face 11. The adhesive 30 is made of a resin having an excellent thermal conductivity. Examples of the resin having an excellent thermal conductivity are a resin of the epoxy group, a polyimide resin, and a resin of the silicon group. To put it concretely, the resin adhesive 30 is made of an electrically conductive adhesive. In this embodiment, the resin adhesive 30 is made of silver paste composed of an Ag filler mixed with the resin of the epoxy group.

A lead frame 40 is placed at locations surrounding the heat sink 10 and the lead frame 40 comprises leads each made of a metal such as Cu or a compound metal called the 42 alloy. The IC chip 20 and the lead frame 40 are joined to each other, being electrically connected to each other by wires 50 each made of a metal such as gold or aluminum.

As shown in FIG. 26, the heat sink 10 and the lead frame 40 are joined to each other by superposing an installation portion 10a of the heat sink 10 and an installation portion 40a of the lead frame 40 on each other and fixing one to the other.

To put it in more detail, a protrusion of the installation portion 10a of the heat sink 10 is engaged with a hole on the installation portion 40a of the lead frame 40. By crimping the protrusion and pushing the protrusion into the hole in order to join the protrusion to the hole, a crimped/fixed junction 40b is created. That is, the crimped/fixed junction 40b is a junction between the installation portions 10a and 40a, firmly joining the heat sink 10 to the lead frame 40 to form a single body. It is to be noted that the heat sink 10 and the lead frame 40 can also be fixed to each other by carrying out a welding or thermal spraying process.

Then, a mold resin package 60 encloses the heat sink 10, the IC chip 20, inner leads 41 of the lead frame 40, and the wires 50, sealing the heat sink 10, the IC chip 20, the inner leads of the lead frame 40, and the wires 50. The other specific face 11 of the heat sink 10 is exposed to the outside of the mold resin package 60 to enhance radiation of heat from the heat sink 10. The mold resin package 60 is made of an ordinary mold material such as a resin of the epoxy group. In this embodiment, the mold resin package 60 is made of the epoxy-group resin, which contains a filler such as silica for typically the purpose of adjusting the thermal expansion coefficient.

In this embodiment, the other face 12 of the heat sink 10 is exposed to the outside of the mold resin package 60 in order to improve the characteristic of heat radiation. In addition, outer leads 42 or the lead frame 40 protrude out from the mold resin package 60, allowing the semiconductor device 300 to be connected to an external substrate.

After the heat sink 10 and the lead frame 40 are joined to each other to form a single body in the semiconductor device 300 in a process such as a crimping process, a welding process, or a thermal spraying process, the IC chip 20 is mounted on the heat sink 10 through an adhesive 30 made of a resin, sandwiching the resin adhesive 30 in conjunction with the heat sink 10. Subsequently, a wire-bonding process and a resin-molding process are carried out. Then, the lead frame 40 is formed and the outer leads 42 are cut to a proper length in the manufacturing process of the semiconductor device 300.

Subsequently, the outer leads 42 protruding out from the mold resin package 60 are attached to for example an external substrate 200 in a soldering process or the like in order to mount the semiconductor device 300 on the external substrate 200 in the same way as the embodiment described earlier.

To put it concretely, the configuration of connection from the semiconductor device 300 to the external substrate 200 through the outer leads 42, that is, the structure of mounting the semiconductor device 300 according to this embodiment on the external substrate 200 is the same as the configuration shown in FIGS. 4 and 5 as the configuration of mounting the semiconductor device 100 on the external substrate 200.

That is, the semiconductor device 300 can be mounted on the external substrate 200 by attaching the outer leads 42 of the lead frame 40 to their respective lands on the external substrate 200 in a soldering process. In this case, as the Pb-free soldering stuff, for example, a soldering material of an Sn—Ag (Ag 3.5) group or a soldering material of an Sn—Ag—Cu group can be used in the soldering process.

By the way, as described above, in a process to mount the semiconductor device 300 on the external substrate 200, the outer leads 42 may be shifted from their correct soldering positions due to bending of the outer leads 42 or other reasons. In order to solve this problem, in the case of the semiconductor device 300 according to this embodiment, a laser beam is applied to the outer leads 42 and the external substrate 200 from a position above the external substrate 200 to recognize the outer leads 42 and scan for their positional shifts on the basis of differences in reflected-light quantity.

In order to assure sufficient light quantities of beams reflected by the outer leads 42, that is, in order to assure lead recognizability of the outer leads 42, and in order to assure the strength of adhesion existing between the inner leads 41 created at the same time as the outer leads 42 and the mold resin package 60, it is necessary to set the degree of roughness of the surfaces of the outer leads 42 or the specific surface area of the surfaces of the outer leads 42 at a value in a proper range. This is because, as described above, the specific surface area is a quantity of a tradeoff between the assurance of the lead recognizability of the outer leads 42 and the assurance of the strength of adhesion existing between the inner leads 41 and the mold resin package 60.

In addition, in order to effectively avoid detachment of the heat sink 10 and the mold resin package 60 from each other and in order to prevent the heat-radiation characteristic of the heat sink 10 from deteriorating due to generation of resin burrs on the other face 12, which is an externally exposed face of the heat sink 10, in a process to create the mold resin package 60, it is necessary to set the degree of roughness of the other face 12 of the heat sink 10 or the specific surface area of the other face 12 of the heat sink 10 at a value in a proper range. This is because, as described above, the specific surface area is a quantity of a tradeoff between the assurance of the strength of adhesion existing between the heat sink 10 and the mold resin package 60 and the assurance of the avoidance of resin burrs.

Thus, in the semiconductor device 300 according to this embodiment, the specific surface area of the surface of the heat sink 10 is set at a value in the range 1.13 to 1.32 whereas the specific surface area of the surfaces of the outer leads 42 is set at a value in the range 1.05 to 1.20.

Much like the embodiment described earlier, this specific surface area can be measured by using an AFM (Atomic Force Microscope). The definition of the specific surface area is the same as that explained before by referring to FIG. 6.

That is, the specific surface area is defined as follows. Assume that the lengths of the sides of a rectangular area shown in FIG. 6 are a and b. In this case, the area of the flat surface with such sides is a×b. The specific surface area is defined as a quotient obtained as a result of division of the actual area of the uneven surface by the area of a×b.

In order to set the specific surface area of the surface of the heat sink 10 and the specific surface area of the surfaces of the outer leads 42 at values in the ranges described above, it is nice to roughen the surfaces of the heat sink 10 and the outer leads 42 of the lead frame 40 at their respective levels.

Also in the case of this embodiment, for example, in the same say as what is shown in FIG. 1B, the surfaces of the heat sink 10 are subjected to plating processes. To be more specific, a roughened Ni plate 10b, a thin Pd plate 10c, and a thin Au plate 10d are created sequentially one plate after another on the base material 10a, which is made of Cu.

In a plating process, the roughened Ni plate 10b can be created by adoption of the generally known method. To put it concretely, in a process of creating the film of the roughened Ni plate 10b as part of an electrolysis plating process or a non-electrolysis plating process, for example, the surface of the roughened Ni plate 10b can be roughened by typically adjusting a current density or the composition of a drug solution used in the process.

As a method of roughening the surface of a plate, the process adopts a method by which the plating conditions such as the current density and the composition of a plating liquid are devised in an electrolysis plating process or a non-electrolysis plating process. In place of this method, however, the surface of a plate can be roughened by carrying out etching and/or sand-blasting processes after a plating process.

It is to be noted that the method of roughening the heat sink 10 in this embodiment can be a method other than the method, which has been described above as a method of roughening the surface of a plate. As explained earlier by referring to FIGS. 2A-2B, the typical other method can be a method of directly roughening the heat-sink material. Examples of the method of directly roughening the heat-sink material include a mechanical fabrication method such as a roughening abrasion technique or a sand-blasting technique, an etching method using chemicals and a heating method using a laser beam or the like.

In addition, also in the case of this embodiment, much like the embodiment described earlier, a film created on the surface of the base material 10a of the heat sink 10 can be a film other than a plate. Examples of the film created on the surface of the base material 10a of the heat sink 10 are an evaporation film, a CVD film, and a film created by adoption of a printing method.

On the top of that, the surface of the lead frame 40 can be roughened in the same way as that of the heat sink 10 described above.

The lead frame 40 has a base material made of an ordinary lead-frame base material such as the copper or the 42-alloy compound metal. A plate film for a roughening purpose can be created on the surface of the lead frame 40. This plate film is created in a plating process carried out after applying etching and/or stamping processes to the raw material of the lead frame 40 to create patterns of the shape of the lead frame 40.

Much like the heat sink 10, the plate film can have a three-layer structure comprising a roughened Ni plate, a relatively thin Pd plate, and a relatively thin Au plate, which are created sequentially one plate after another on the ground layer (or the base material) of the lead frame 40. It is to be noted that, in some cases, the plate film can have a two-layer structure excluding the relatively thin Au plate on the outermost layer.

Also in a process to use a plate film for roughening the surface of the lead frame 40, the Ni plate can be created by for example adoption of a method by which the plating conditions and the composition of a plating liquid are adjusted in creation of the plate film.

In addition, also in the case of the lead frame 40, a chemical roughening process using chemicals may be carried out as an etching process on the pre-plating base material of the lead frame 40 or the post-plating lead frame 40 in order to roughen the surface of the lead frame 40. In place of the chemical roughening process, a mechanical roughening process such as a sand-blasting process may also be carried out to roughen the surface of the lead frame 40.

Then, the heat sink 10 and the lead frame 40, which complete the roughening processes carried out separately to result in their specific surface areas, are joined to each other to form a single body by typically carrying out a crimping process before being used in the fabrication processes described above to produce the semiconductor device 300 according to the embodiment.

As described above, the semiconductor device 300 according to the embodiment is characterized in that the semiconductor device 300 comprises:

a heat sink 10;

an IC chip 20 mounted and fixed on the heat sink 10;

a lead frame 40 provided at locations surrounding the IC chip 20 and electrically connected to the IC chip 20; and a sealing mold resin package 60 for enclosing the heat sink 10, the IC chip 20, and the lead frame 40, wherein:

a portion of the heat sink 10 is exposed to the outside of the mold resin package 60;

a portion of the lead frame 40 protrudes out from the mold resin package 60 as outer leads 42;

the specific surface area of the surface of the heat sink 10 is set at a value in the range 1.13 to 1.32; and the specific surface area of the surfaces of the outer leads 42 is set at a value in the range 1.05 to 1.20.

The specific surface area of the surface of the heat sink 10 and the specific surface area of the surfaces of the outer leads 42 are set at values in the range described above on the basis of study results shown in FIG. 27 as results of a study, which was conducted by the inventors of the present invention as a study of the specific surface areas.

Figure 27:
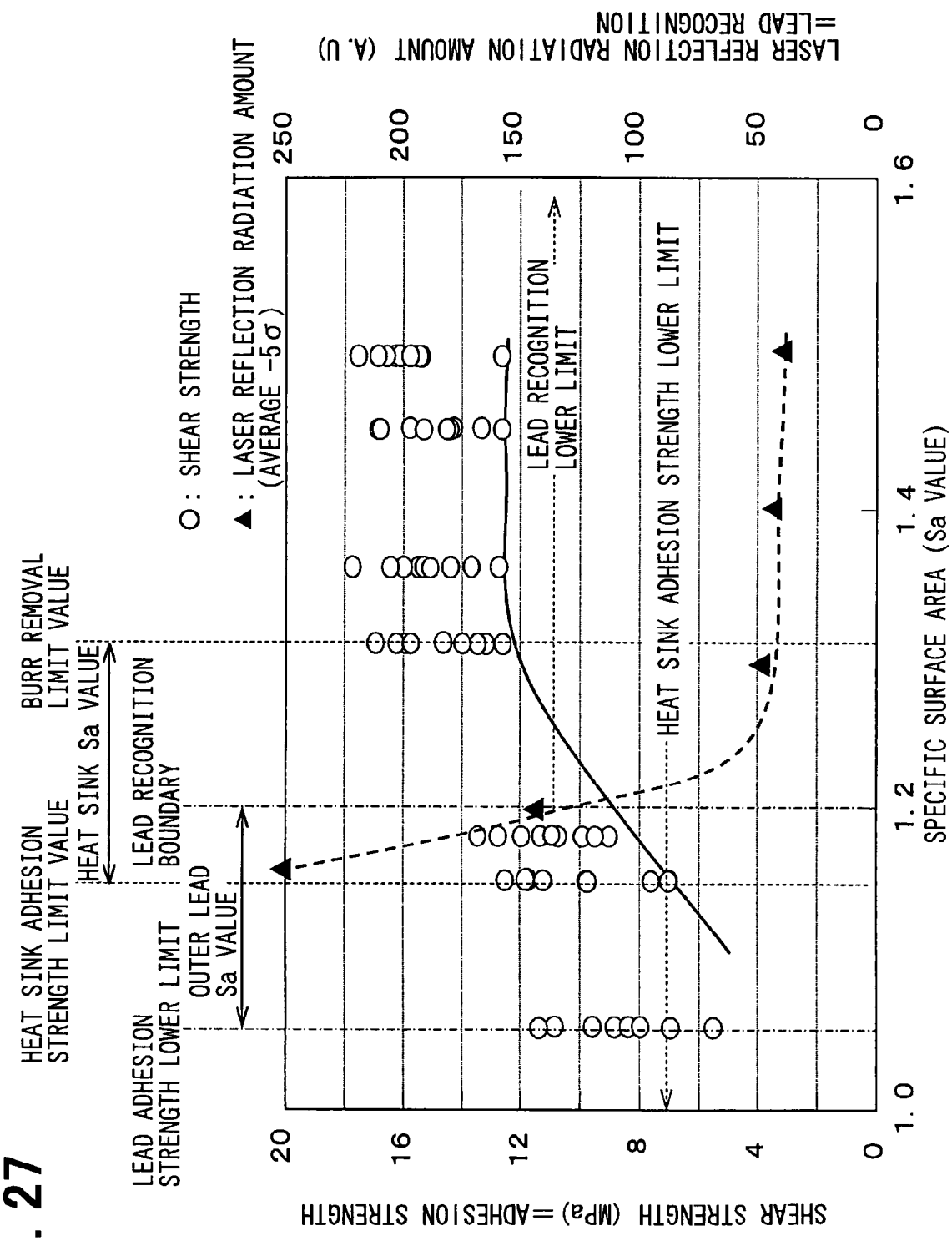
FIG. 27 is a diagram showing relations between the specific surface area and a shear strength as well as between the specific surface area and a reflected-light quantity.
Figure 28:
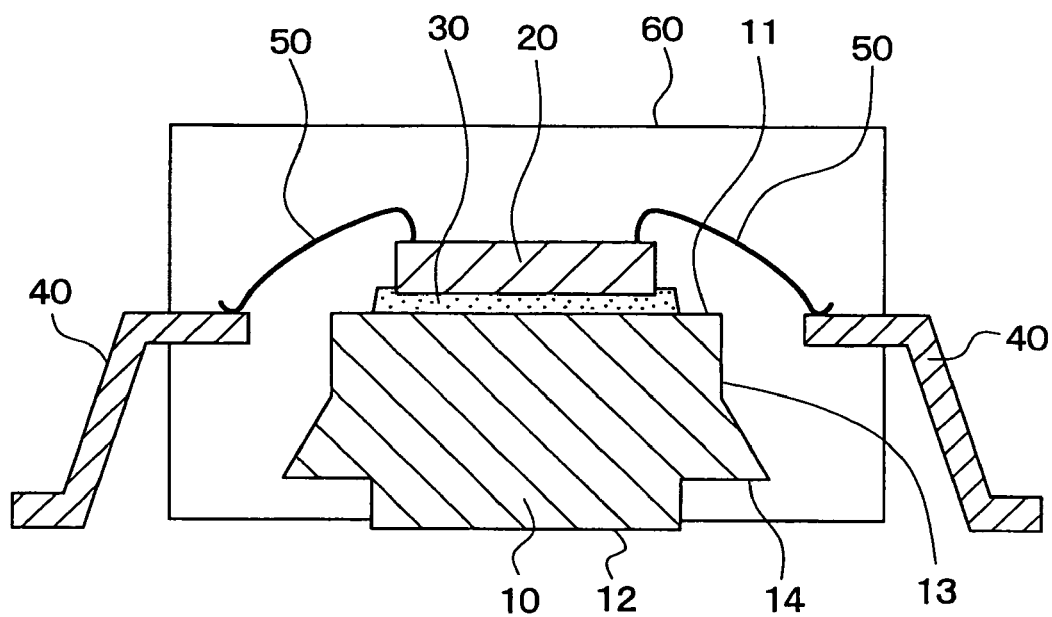
FIG. 28 is a diagram showing a schematic cross-sectional configuration of a semiconductor device of an ordinary conventional resin mold package type.

In FIG. 27, the horizontal axis represents an Sa value expressing the specific surface areas of the heat sink 10 and the lead frame 40. The left-side vertical axis represents a shear strength expressed in terms of MPa units. On the other hand, the right-side vertical axis represents a reflected-laser quantity, which can be expressed in terms of any units.

A plurality of shear strengths each indicated by white circle was obtained for every specific surface area. The bottom white circles, which each represent the smallest quantity among the shear strengths obtained for a specific surface area, are connected to each other to form a solid-line curve. As for the reflected-laser quantity, black triangles each representing a −5-sigma average form a dashed-line curve.

In the above results of the study, the shear strength represents the strength of adhesion existing between the heat sink 10 and the mold resin package 60. The greater the shear strength, the larger the strength of the adhesion. On the other hand, the reflected-laser quantity indicates lead recognizability, which is an indicator of how recognizable the outer leads 42 are. The larger the reflected-laser quantity, the more excellent the lead recognizability of the outer leads 42.

In addition, FIG. 27 also shows a variety of limits at practical-use levels. For example, a heat-sink adhesion-strength lower limit is the lower limit of the shear strength representing the strength of the adhesion existing between the heat sink 10 and the mold resin package 60. On the other hand, a lead-recognizability lower limit is the lower limit of the reflected-laser quantity indicating the lead recognizability of the outer leads 42.

On the top of that, the following limits are used for the specific surface area.

A resin burr removal limit is a specific surface area value corresponding to a shear-strength upper limit, shear strengths smaller than which allow resin burrs generated on the exposed other face 12 of the heat sink 10 to be removed.

A heat-sink adhesion-strength limit is a specific surface area value corresponding to the heat-sink adhesion-strength lower limit described above as the lower limit of the shear strength representing the strength of the adhesion existing between the heat sink 10 and the mold resin package 60.

A lead-adhesion strength lower limit is a specific surface area value corresponding to a shear-strength lower limit, shear strengths greater than which allow detachment of the inner leads 41 and the mold resin package 60 from each other to be avoided.

A lead recognition limit is a specific surface area value corresponding to the lead-recognizability lower limit, which is the lower limit of the reflected-laser quantity indicating the lead recognizability of the outer leads 42 as described above.

As shown in FIG. 27, for specific hear areas smaller than a heat-sink adhesion-strength limit of 1.13, the strength of the adhesion existing between the heat sink 10 and the mold resin package 60 is not sufficient so that the heat sink 10 and the mold resin package 60 can be detached from each other with ease. For specific hear areas greater than a resin burr removal limit of 1.32, on the other hand, the strength of the adhesion existing between the heat sink 10 and the mold resin package 60 is too large, causing resin burrs to be generated on the exposed other face 12 of the heat sink 10. As a result, resin burrs stuck on the other face 12 become difficult to remove.

For the reasons described above, the specific surface area of the heat sink 10 is set at a value in the range 1.13 to 1.32 so that it is possible to assure a sufficient adhesion strength, which is large enough for effectively avoiding detachment of the heat sink 10 and the mold resin package 60 from each other, while properly preventing resin burrs from sticking on the exposed other face 12 of the heat sink 10.

Also as shown in FIG. 27, when the specific surface area of the outer leads 42 is smaller than a lead-adhesion strength lower limit of 1.05, the strength of the adhesion existing between the inner leads 41 and the mold resin package 60 is not sufficient so that the inner leads 41 and the mold resin package 60 can be detached from each other with ease.

Thus, the adhesion existing between the inner leads 41 and the mold resin package 60 can be assured at a smaller specific surface area of the outer leads 42 than the specific surface area required of the heat sink 10 as a specific surface area for assuring the adhesion existing between the heat sink 10 and the mold resin package 60. When the specific surface area of the outer leads 42 is greater than a lead recognition limit of 1.20, on the other hand, the quantities of beams reflected by the outer leads 42 are not sufficient so that the recognizability of the outer leads 42 cannot be assured.

For the reasons described above, the specific surface area of the outer leads 42 is set at a value in the range 1.05 to 1.20 so that it is possible to assure the recognizability of the outer leads 42 while avoiding detachment of the inner leads 41 and the mold resin package 60 from each other since the inner leads 41 has a specific surface area all but equal to that of the outer leads 42.

As described above, in the semiconductor device 300 according to this embodiment, the specific surface area of the surface of the heat sink 10 is set at a value in the range 1.13 to 1.32 and the specific surface area of the surfaces of the outer leads 42 is set at a value in the range 1.05 to 1.20 so that the semiconductor device 300 including the sealing mold resin package 60 for enclosing the heat sink 10, the IC chip 20, and the lead frame 40 is capable of assuring a sufficient adhesion strength, which is large enough for effectively avoiding detachment of the heat sink 10 and the mold resin package 60 from each other, while properly preventing resin burrs from sticking on the exposed other face 12 of the heat sink 10 as well as implementing both the recognizability of the outer leads 42 and the strength of adhesion existing between the inner leads 41 and the mold resin package 60.

In addition, in accordance with the semiconductor device 300 according to this embodiment exhibiting the effects described above, positional shifts of the outer leads 42 can be detected appropriately and precisely in a process of mounting the semiconductor device 300 on an external substrate 200 so that it is possible to present the semiconductor device 300, which has no resin burrs and, hence, has an excellent heat-radiation characteristic as well as high reliability capable of effectively avoiding detachment of the heat sink 10 and the mold resin package 60 from each other and capable of effectively preventing the inner leads 41 and the mold resin package 60 from being detached from each other.

On the top of that, as shown in FIG. 25, as one of characteristics of the semiconductor device 300 according to this embodiment, the heat sink 10 has a protrusion 14 protruding out from the side face 13 of the heat sink 10 bites into the mold resin package 60. Thus, the adhesion existing between the mold resin package 60 and the heat sink 10 can be improved.

As another characteristic of the semiconductor device 300 according to this embodiment, the IC chip 20 is stuck firmly on the heat sink 10 through the adhesive 30 made of a resin, sandwiching the resin adhesive 30 in conjunction with the heat sink 10. As a further characteristic of the semiconductor device 300 according to this embodiment, the resin adhesive 30 and the mold resin package 60 can each be made of a resin of the epoxy group.

In addition, the semiconductor device 300 according to this embodiment can be fabricated by setting the specific surface areas of the heat sink 10 and the lead frame 40 at values in the ranges described above in fabrication processes separated from each other from the beginning as processes to create the heat sink 10 and the lead frame 40 without specially carrying out special processes to set the specific surface areas after the fabrication processes. Thus, the semiconductor device 300 according to this embodiment can be fabricated without essentially increasing the fabrication cost.

Other Embodiments

In the case of the embodiments described above, the IC chip 20 and the lead frame 40 are connected electrically to each other by using the wires 50. It is to be noted, however, that another method can also be adopted.

In addition, no protrusion (or coining) 14 may be created on the side face 13 of the heat sink 10. Furthermore, when a protrusion 14 is created on the side face 13 of the heat sink 10, the shape of the protrusion 14 is not limited to the typical one shown in the figures. That is, the protrusion 14 can have any shape as long as the shape improves the adhesion existing between the heat sink 10 and the mold resin package 60.

On the top of that, when the surface of the heat sink 10 is designed into a configuration including plates, the plates do not have to be the plates described above. That is, it is possible to create plates made of a variety of materials into a different layer-stacking configuration.

Generally, the present disclosure concerns a semiconductor device comprised of a heat sink; a semiconductor chip mounted and fixed on the heat sink; a lead frame provided at locations surrounding the semiconductor chip and electrically connected to the semiconductor chip; and a sealing mold resin package for enclosing the heat sink, the semiconductor chip, and the lead frame, wherein the specific surface area of the surface of the heat sink and the specific surface area of the surface of the lead frame are each set at a value in one of the ranges described above and other portions can be properly designed and/or changed.

What is claimed is:

1. A semiconductor device comprising:
a heat sink having a surface with a predetermined range of surface roughening;
an IC chip mounted and fixed on a specific face of the heat sink;
a lead frame provided at locations surrounding the IC chip and electrically connected to the IC chip; and
a sealing mold resin package for enclosing the heat sink, the IC chip, and the lead frame, wherein:
a portion of the heat sink is exposed to the outside of the mold resin package;
a portion of the lead frame protrudes out from the mold resin package as outer leads having a surface with a different predetermined range of surface roughening;
when a specific surface area is defined as a ratio of an actual area of uneven surface to an area of an imaginary flat surface, the specific surface area of a surface of the heat sink is set at a value in the range 1.13 to 1.32; and
the specific surface area of the surface of the outer leads is set at a value in the range 1.05 to 1.20 to optimize heat sink adhesion strength, resin-burr formation, and outer-lead placement on an external substrate.

2. A semiconductor device according to claim 1, wherein the heat sink has a protrusion that bites into the mold resin package.

3. A semiconductor device according to claim 1, wherein the IC chip is attached and fixed on the heat sink through an adhesive made of a resin, sandwiching the adhesive in conjunction with the heat sink.

4. A semiconductor device according to claim 3, wherein the adhesive is made of a resin of an epoxy group.

5. A semiconductor device according to claim 1, wherein the mold resin package is made of a resin of an epoxy group.

6. A semiconductor device according to claim 1, wherein at least one of the surfaces of the heat sink and outer leads comprises an electrically plated roughened surface.

7. A semiconductor device according to claim 1, wherein at least one of the surfaces of the heat sink and outer leads comprises an abrasion roughened surface.

8. A semiconductor device according to claim 1, wherein at least one of the surfaces of the heat sink and outer leads comprises a sand blasted roughened surface.

9. A semiconductor device according to claim 1, wherein at least one of the surfaces of the heat sink and outer leads comprises a chemically etched roughened surface.

10. A semiconductor device according to claim 1, wherein at least one of the surfaces of the heat sink and outer leads comprises a laser beam roughened surface.

* * * * *